(12) United States Patent
Ryu et al.

(10) Patent No.: US 11,882,687 B2
(45) Date of Patent: Jan. 23, 2024

(54) SEMICONDUCTOR DEVICES

(71) Applicant: Samsung Electronics Co., Ltd., Suwon-si (KR)

(72) Inventors: Kyungsun Ryu, Hwaseong-si (KR); Duckhee Lee, Busan (KR); Junwon Lee, Asan-si (KR); Younseok Choi, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 197 days.

(21) Appl. No.: 17/368,053

(22) Filed: Jul. 6, 2021

(65) Prior Publication Data
US 2022/0165736 A1    May 26, 2022

(30) Foreign Application Priority Data
Nov. 26, 2020 (KR) .................... 10-2020-0161115

(51) Int. Cl.
*H10B 12/00* (2023.01)

(52) U.S. Cl.
CPC .................................. *H10B 12/315* (2023.02)

(58) Field of Classification Search
None
See application file for complete search history.

(56) References Cited

U.S. PATENT DOCUMENTS

| 9,305,831 | B2 | 4/2016 | Ren et al. |
| 9,337,203 | B2 | 5/2016 | Hwang et al. |
| 9,343,355 | B2 | 5/2016 | Lim et al. |
| 9,620,451 | B2 | 4/2017 | Hwang et al. |
| 9,640,424 | B2 | 5/2017 | Ren et al. |
| 9,685,318 | B2 | 6/2017 | Park et al. |
| 10,644,008 | B2 | 5/2020 | Lee et al. |
| 10,707,215 | B2 | 7/2020 | Simsek-Ege et al. |
| 2012/0104485 | A1 | 5/2012 | Yang et al. |

(Continued)

FOREIGN PATENT DOCUMENTS

| KR | 10-2012-0043979 A | 5/2012 |
| KR | 10-2015-0104337 A | 9/2015 |
| KR | 10-2016-0048553 A | 5/2016 |

(Continued)

*Primary Examiner* — Steven M Christopher
(74) *Attorney, Agent, or Firm* — Harness, Dickey & Pierce, P.L.C.

(57) ABSTRACT

A semiconductor device includes an active pattern on a substrate, a gate structure buried at an upper portion of the active pattern, a bit line structure on the active pattern, a spacer structure on a sidewall of the bit line structure, a contact plug structure contacting the spacer structure, an insulating interlayer structure partially penetrating through upper portions of the contact plug structure, the spacer structure and the bit line structure, and a capacitor on the contact plug structure. The spacer structure includes an air spacer including air. The insulating interlayer structure includes first and second insulating interlayers. The second insulating interlayer may include an insulation material different from that of the first insulating interlayer. A lower surface of the second insulating interlayer covers a top of the air spacer, and a lowermost surface of the first insulating interlayer is covered by the second insulating interlayer.

20 Claims, 19 Drawing Sheets

(56) References Cited

U.S. PATENT DOCUMENTS

2019/0164975 A1* 5/2019 Song .................... H10B 12/485
2020/0203354 A1 6/2020 Lee et al.

FOREIGN PATENT DOCUMENTS

| KR | 10-2016-0138290 A | 12/2016 |
| KR | 10-2019-0024251 A | 3/2019 |
| KR | 10-2020-0079366 A | 7/2020 |

* cited by examiner

SEMICONDUCTOR DEVICES

CROSS-REFERENCE TO RELATED APPLICATION

This application claims priority under 35 U.S.C. § 119 to Korean Patent Application No. 10-2020-0161115 filed on Nov. 26, 2020 in the Korean Intellectual Property Office, the disclosure of which is hereby incorporated by reference in its entirety.

BACKGROUND

Some example embodiments of inventive concepts relate to a semiconductor device. More particularly, some example embodiments of inventive concepts relate to a DRAM device including a bit line structure.

Recently, as a space between bit lines is narrowed due to a miniaturization of a dynamic random access memory (DRAM) device, bit line loading capacitance (CBL) may be increased. The increase in CBL may decrease a sensing margin associated with the DRAM device. In order to reduce CBL, the DRAM device may include/define an air spacer containing air, and a method of forming the air spacer having a sufficiently large size has been studied.

SUMMARY

Some example embodiments provide a semiconductor device having improved characteristics.

According to some example embodiments of inventive concepts, there is a semiconductor device. The semiconductor device may include an active pattern on a substrate, a gate structure in an upper portion of the active pattern, a bit line structure on the active pattern, the bit line structure including a conductive structure and a capping pattern that are stacked, a spacer structure on a sidewall of the bit line structure, a contact plug structure on the active pattern, the contact plug structure contacting the spacer structure, an insulating interlayer structure partially penetrating through upper portions of the contact plug structure, the spacer structure and the bit line structure, and a capacitor on the contact plug structure. The spacer structure defines an air spacer, the insulating interlayer structure includes a first insulating interlayer, and a second insulating interlayer on the first insulating interlayer, the second insulating interlayer including an insulation material different from materials included in the first insulating interlayer. A lower surface of the second insulating interlayer covers a top of the air spacer. The second insulating interlayer covers a lowermost surface of the first insulating interlayer.

According to some example embodiments of inventive concepts, there is a semiconductor device. The semiconductor device may include an active pattern on a substrate, a gate structure in an upper portion of the active pattern, a bit line structure on the active pattern, the bit line structure including a conductive structure and a capping pattern that are stacked, a spacer structure on a sidewall of the bit line structure, a contact plug structure on the active pattern, the contact plug structure contacting the spacer structure, an insulating interlayer structure partially penetrating through upper portions of the contact plug structure, the spacer structure and the bit line structure, and a capacitor on the contact plug structure. The spacer structure defines an air spacer, the insulating interlayer structure includes a first insulating interlayer, a second insulating interlayer on the first insulating interlayer, and a third insulating interlayer on the second insulating interlayer. A lower surface of the second insulating interlayer covers a top of the air spacer, and a second ratio of a thickness of a lowermost portion of the second insulating interlayer to a thickness of an uppermost portion of the second insulating interlayer is greater than a first ratio of a thickness of a lowermost portion of the first insulating interlayer to a thickness of an uppermost portion first insulating interlayer, the respective thicknesses of the uppermost portions of the first and second insulating interlayers being greater than the respective thicknesses of the lowermost portions of the first and second insulating interlayers.

According to some example embodiments of inventive concepts, there is a semiconductor device. The semiconductor device may include an active pattern on a substrate, a gate structure in an upper portion of the active pattern, a bit line structure on the active pattern, the bit line structure including a doped polysilicon pattern, a metal pattern, and a capping pattern, the doped polysilicon pattern, the metal pattern, and the capping pattern sequentially stacked, a spacer structure defining an air spacer containing air, the spacer structure including a first spacer containing a nitride, and a third spacer containing a nitride, the first spacer, the air spacer, and the third spacer sequentially stacked from a sidewall of the bit line structure in a horizontal direction substantially parallel to an upper surface of the substrate, a contact plug structure on the active pattern, the contact plug structure contacting the spacer structure, an insulating interlayer structure partially penetrating through upper portions of the contact plug structure, the spacer structure and the bit line structure, and a capacitor on the contact plug structure. The insulating interlayer structure includes a first insulating interlayer including a first insulation material, a second insulating interlayer on the first insulating interlayer, the second insulating interlayer including a second insulation material different from materials included in the first insulation material, and a third insulating interlayer on the second insulating interlayer, the third insulating interlayer including a third insulation material. A lower surface of the second insulating interlayer covers a top of the air spacer, and the second insulating interlayer covers a lowermost surface of the first insulating interlayer.

In the semiconductor device, CBL may be reduced by the air spacer having a sufficient size and/or a sufficient thickness and/or a sufficient dielectric constant, thus the semiconductor device including/defining the air spacer may have enhanced electrical characteristics.

DETAILED DESCRIPTION OF SOME EXAMPLE EMBODIMENTS

The above and other aspects and features of a method of cutting a fine pattern, a method of forming active patterns using the same, and/or a method of manufacturing a semiconductor device using the same in accordance with some example embodiments will become readily understood from detail descriptions that follow, with reference to the accompanying drawings. It will be understood that, although the terms "first," "second," and/or "third" may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer and/or section discussed below could be termed a second or third element, component, region, layer or section without departing from the teachings of inventive concepts.

Figure 1:
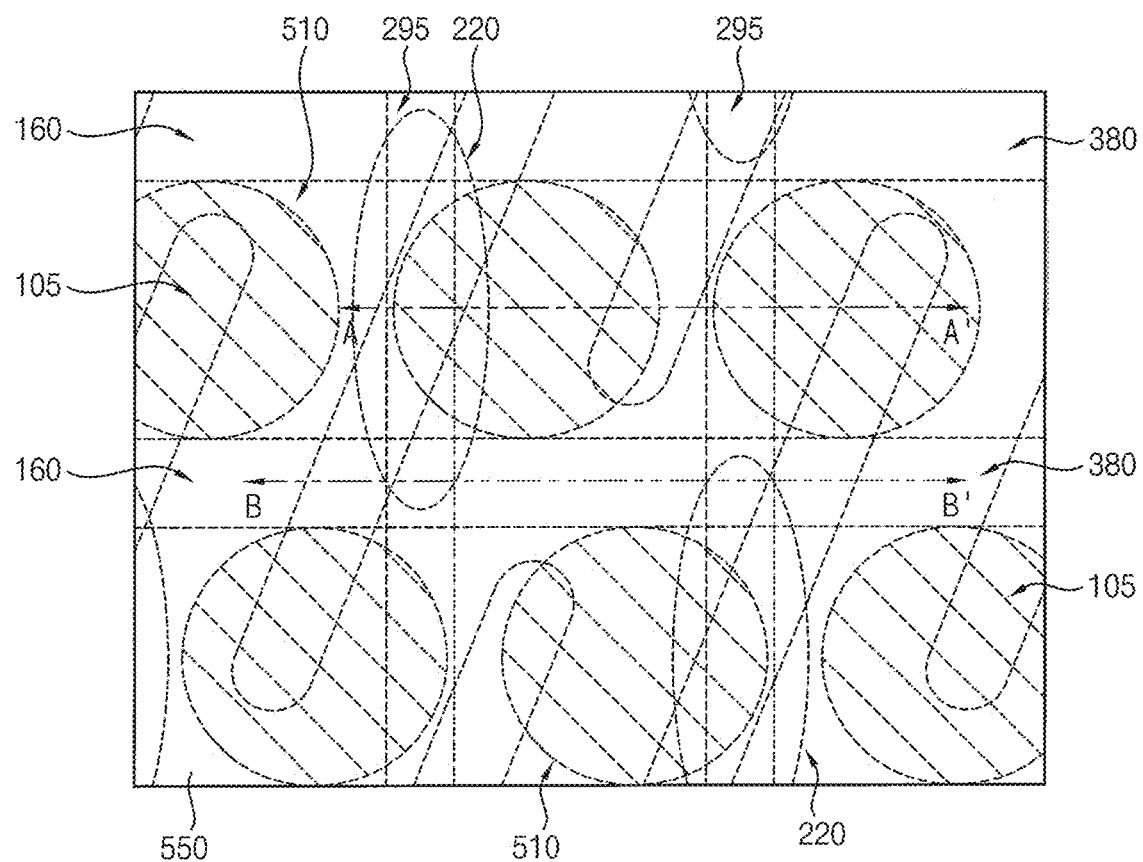
FIGS. 1 and 3 are a plan view and cross-sectional views illustrating a semiconductor device in accordance with some example embodiments.
Figure 1:
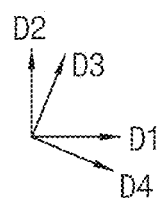
Figure 2:
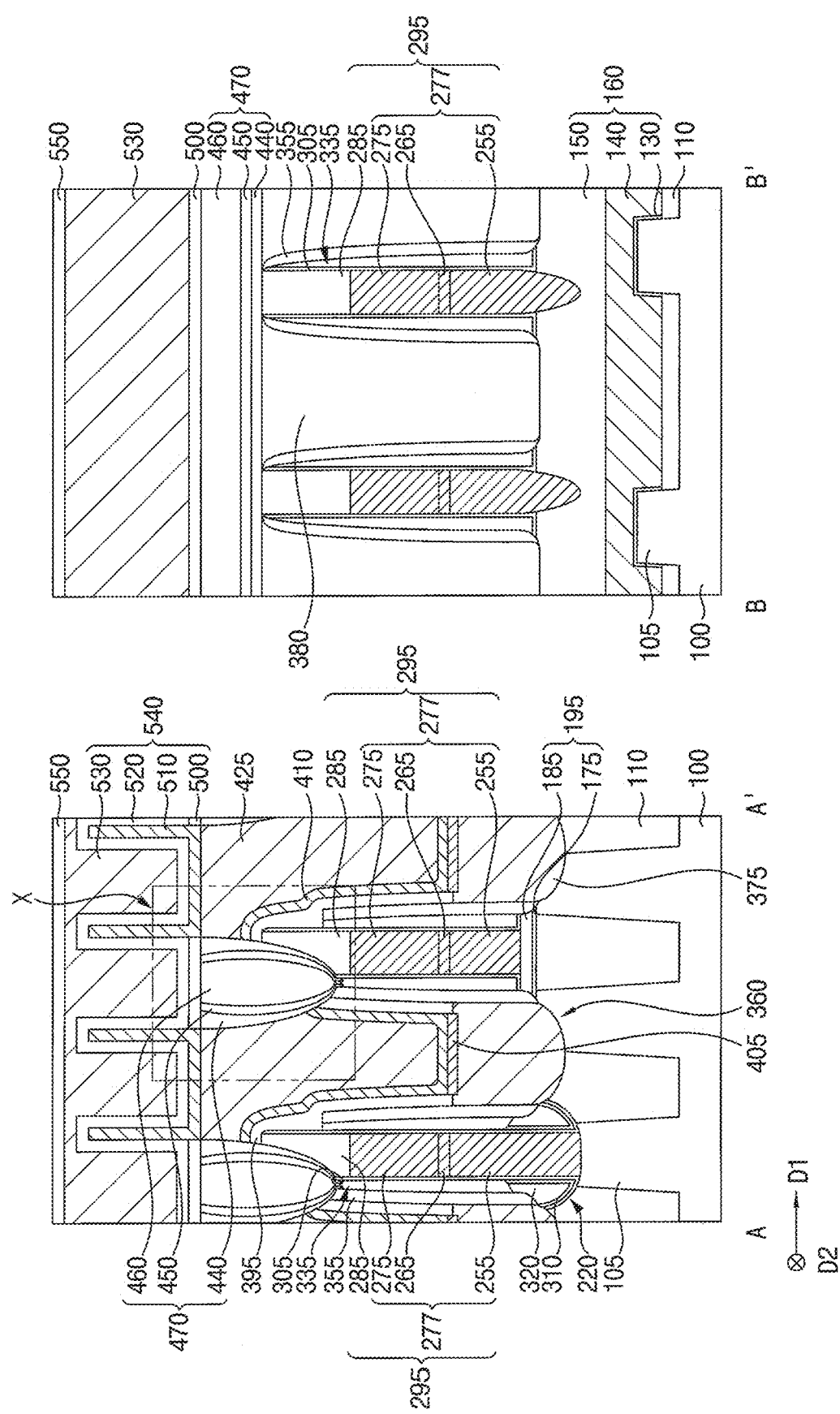

FIGS. 1 and 2 are a plan view and a cross-sectional view, respectively, illustrating a semiconductor device in accordance with some example embodiments. FIG. 2 includes cross-sections taken along lines A-A' and B-B' of FIG. 1, and FIG. 3 is an enlarged cross-sectional view of region X of FIG. 2.

Hereinafter, in the specifications (but not necessarily in the claims), two directions substantially parallel to an upper surface of a substrate 100 and substantially perpendicular to each other may be referred to as first and second directions, respectively, a direction substantially parallel to the upper surface of the substrate 100 and having an acute angle with respect to the first and second directions may be referred to as a third direction, and a direction substantially parallel to the upper surface of the substrate 100 and substantially perpendicular to the third direction may be referred to as a fourth direction.

Figure 3:
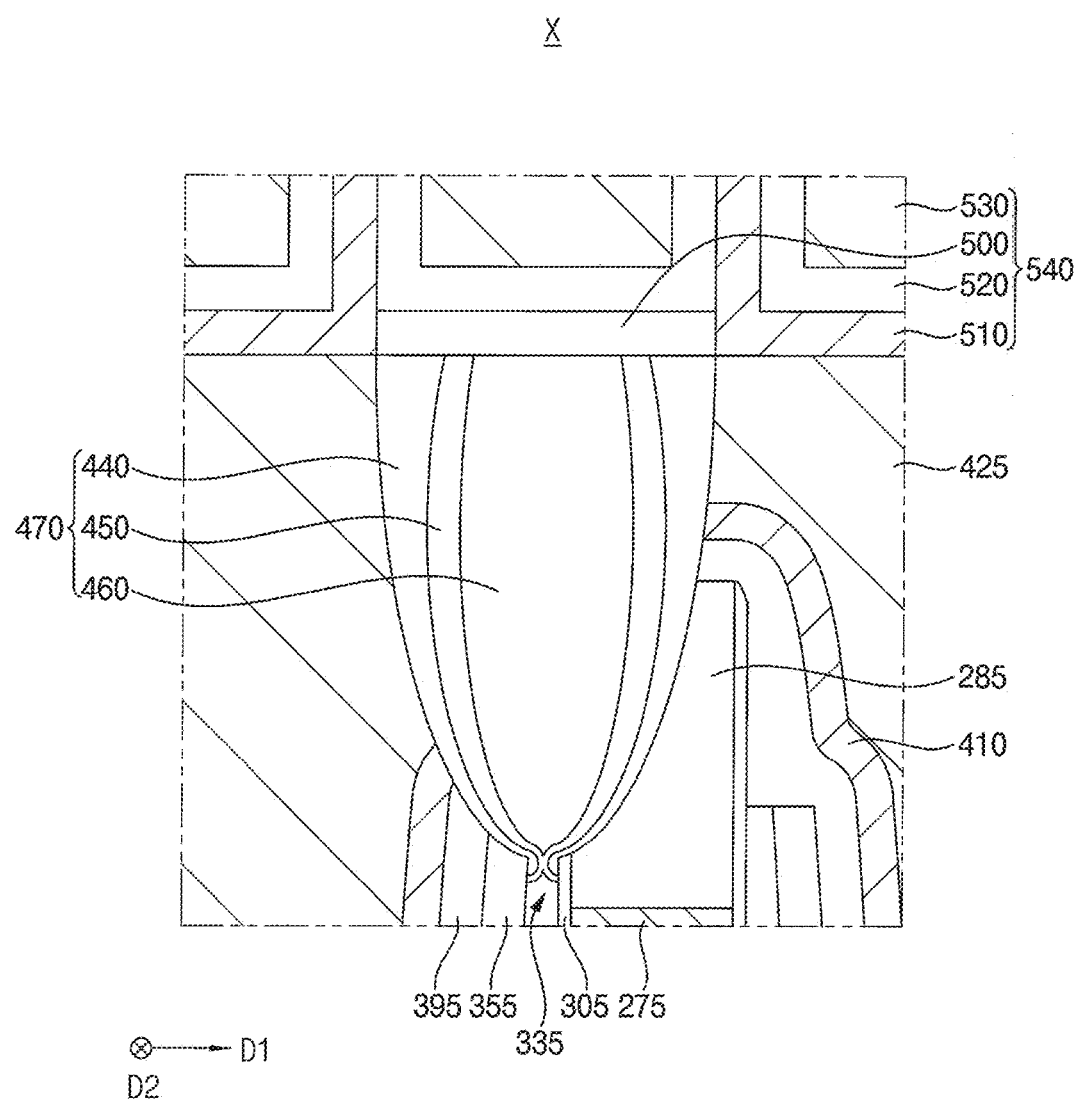

Referring to FIGS. 1 to 3, the semiconductor device may include a gate structure 160, a bit line structure 295, a spacer structure, a contact plug structure, an insulating interlayer structure 470, and a capacitor 540. Additionally, the semiconductor device may include a second capping pattern 380, an insulation pattern structure 195, an etch stop layer 500.

The substrate 100 may be or may include doped or undoped single-crystal or polycrystalline silicon, germanium, silicon-germanium, a III-V group compound semiconductor, such as GaP, GaAs, or GaSb. In some example embodiments, the substrate 100 may be or may include a silicon-on-insulator (SOI) substrate and/or a germanium-on-insulator (GOI) substrate.

An isolation pattern 110 may be formed on the substrate 100, and an active pattern 105 of which a sidewall is covered by the isolation pattern 110 may be defined on the substrate 100. The isolation pattern 110 may include an oxide, e.g., silicon oxide, and may be a shallow-trench isolation (STI) pattern.

In some example embodiments, a plurality of active patterns 105 may be spaced apart from each other in each of the first and second directions, and each of the active patterns 105 may extend in the third direction to a certain length. The active patterns 105 may be collinear with each other in the third direction D3. The active patterns 105 may have a bar shape or an island shape and may have extensions and/or other features such as wings in the center of each bar shape; however, example embodiments are not limited thereto.

The gate structure 160, e.g. the word line, may extend in the first direction through upper portions of the active pattern 105 and the isolation pattern 110, and a plurality of gate structures 160 may be spaced apart from each other in the second direction. For example, the gate structure 160 may be buried at upper portions of the active pattern 105 and the isolation pattern 110. The gate structure 160 may include a gate insulation layer 130, a gate electrode 140 and a gate mask 150 that are sequentially stacked in a vertical direction substantially perpendicular to the upper surface of the substrate 100.

The gate insulation layer 130 may be formed on a surface of the active pattern 105, the gate electrode 140 may extend in the first direction on the gate insulation layer 130 and the isolation pattern 110, and the gate mask 150 may cover an upper surface of the gate electrode 140.

The gate insulation layer 130 may be or include an oxide, e.g., silicon oxide that is deposited and/or grown within the substrate 100, the gate electrode 140 may include a metal, e.g., at least one of doped polysilicon, tungsten, titanium, tantalum, etc., and/or a metal nitride, e.g., tungsten nitride, titanium nitride, tantalum nitride, etc., and the gate mask 150 may include a nitride, e.g., silicon nitride.

In some example embodiments, the bit line structure 295 may extend in the second direction on the active pattern 105, the isolation pattern 110 an the gate structure 160, and a plurality of bit line structures 295 may be spaced apart from each other in the first direction. Each of the bit line structures 295 may contact a middle portion in the third direction of an upper surface of the active pattern 105.

The bit line structure 295 may extend in the vertical direction, and may include a conductive structure 277 and a first capping pattern 285 that are sequentially stacked in the vertical direction.

The conductive structure 277 may include a doped or undoped polysilicon pattern 255, a diffusion barrier 265, and a metal pattern 275.

Figure 9:
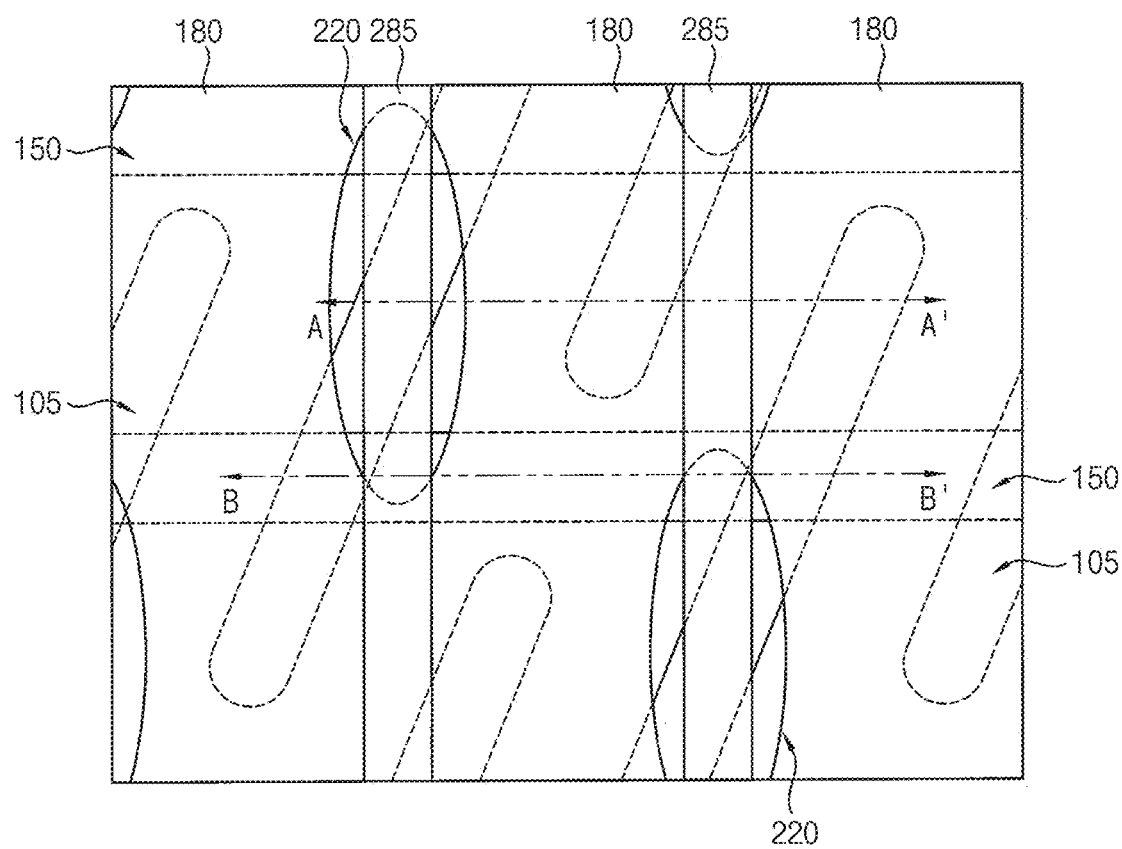
Figure 9:
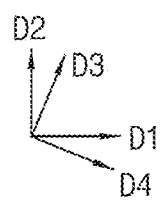
Figure 10:
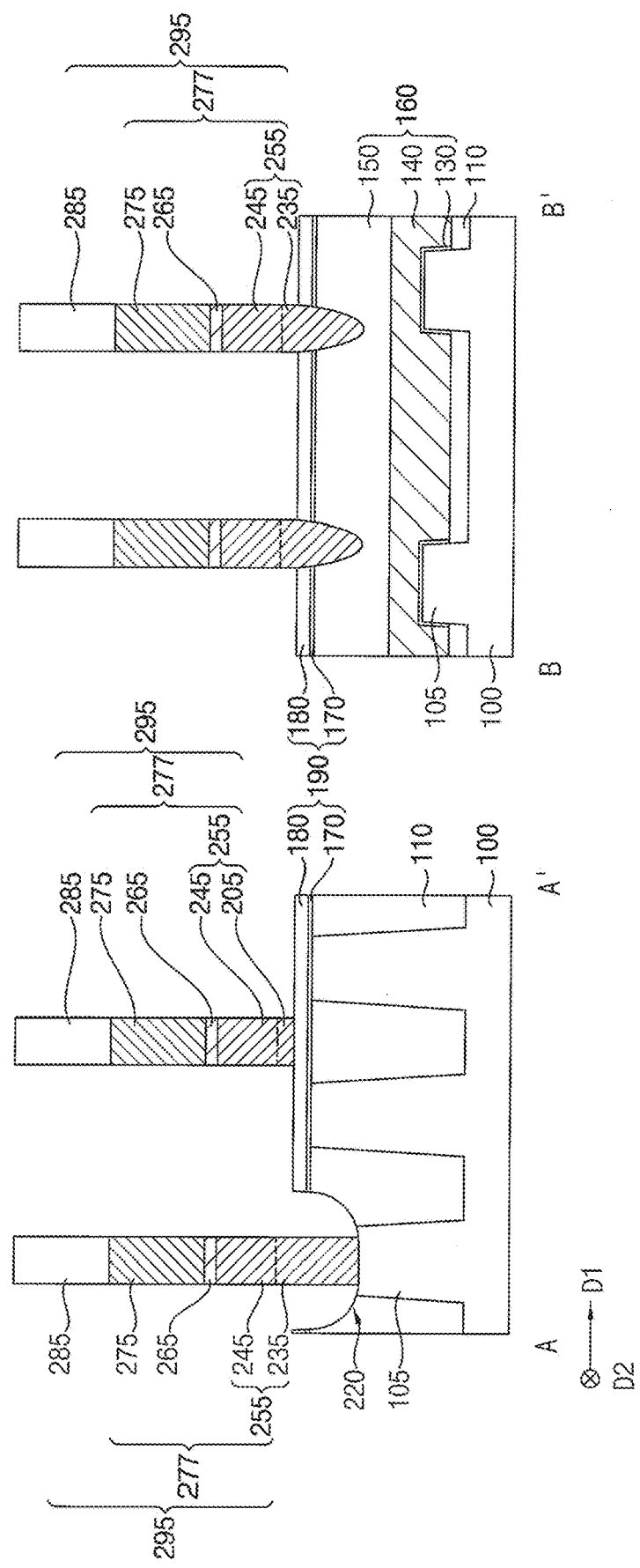

The polysilicon pattern 255 may include second and third conductive patterns 235 and 245 sequentially stacked (see FIGS. 9 and 10) and/or first and third conductive patterns 205 and 245 sequentially stacked (see FIGS. 9 and 10). A plurality of second conductive patterns 235 may be spaced apart from each other in each of the first and second directions. For example, each of the second conductive patterns 235 may be formed in a second recess 220 on an upper surface of the active pattern 105 and upper surfaces of the isolation pattern 110 and the gate mask 150 adjacent thereto, and each of the first conductive patterns 205 may be formed at an outside of the second recess 220. The third conductive pattern 245 may extend in the second direction on the first and second conductive patterns 205 and 235 disposed in the second direction. In some example embodiments, each of the first to third conductive patterns 205, 235 and 245 may include, e.g., polysilicon doped with n-type impurities such as at least one of phosphorus or arsenic each having the same or different concentrations of impurities, and thus may be merged to form the polysilicon pattern 255.

Each of the diffusion barrier 265 and the metal pattern 275 may extend in the second direction on the polysilicon pattern 255. The diffusion barrier 265 may include a metal silicon nitride, e.g., titanium silicon nitride (TiSiN), and the metal pattern 275 may include a metal, e.g., at least one of tungsten, copper, aluminum, titanium, tantalum, etc.

Each of the first capping patterns 285 may extend in the second direction on the conductive structure 277. The first capping pattern 285 may include a nitride, e.g., silicon nitride.

The spacer structure may be formed on each of opposite sidewalls in the first direction of the bit line structure 295, and thus may extend in the second direction. The spacer structure may include/may define or surround a first spacer 305, an air spacer 335, a third spacer 355 and a fourth spacer 395 that are sequentially stacked in the first direction on each of opposite sidewalls in the first direction of the bit line structure 295. The first spacer 305 may contact each of opposite sidewalls in the first direction of the bit line structure 295, the air spacer 335 may contact or surround or define all or at least a portion of a portion of an outer sidewall of the first spacer 305, the third spacer 355 may contact or surround or define all or at least a portion of an outer sidewall of the air spacer 335, and the fourth spacer 395 may contact or surround or define all or at least a portion of an upper surface of the first capping pattern 285, an upper surface and an upper outer sidewall of the first spacer 305, a top of the air spacer 335, and an upper surface and an upper outer sidewall of the third spacer 355. However, in an area where the sidewall in the first direction of the bit line structure 295 is covered by the second capping pattern 380, the air spacer 335 and the third spacer 355 may be sequentially stacked in the first direction on the outer sidewall of the first spacer 305, and the fourth spacer 395 might not be formed.

In some example embodiments, uppermost surfaces of the air spacer 335 and the third spacer 355 may be lower than an uppermost surface of the first spacer 305, and may be higher than an upper surface of the metal pattern 275 of the bit line structure 295.

In some example embodiments, the first, second and fourth spacers 305, 355 and 395 may include a nitride, e.g., silicon nitride. The air spacer 335 may include air such as clean, dry air and/or may be in vacuum, e.g. may have a pressure less than atmospheric pressure; however, example embodiments are not limited thereto.

A sidewall of a portion of the bit line structure 295 in the second recess 220 and a bottom of the second recess 220 may be covered by the first spacer 305. A third insulation pattern 310 may be formed on a portion of the first spacer 305 in the second recess 220, and a fourth insulation pattern 320 may be formed on the third insulation pattern 310 to fill a remaining portion of the second recess 220. In some example embodiments, the air spacer 335 may contact upper surfaces of the third and fourth insulation patterns 310 and 320, and the third spacer 355 may contact an upper surface of the fourth insulation pattern 320.

The insulation pattern structure 195 including first and second insulation patterns 175 and 185 sequentially stacked in the vertical direction may be formed between the bit line structure 295 and portions of the active pattern 105 and the isolation pattern 110 at an outside of the second recess 220. The second insulation pattern 185 may contact (e.g. may directly contact) a lower surface of the first spacer 335 having a cross-section of an "L" shape.

Each of the second and fourth insulation patterns 185 and 320 may include a nitride, e.g., silicon nitride, and each of the first and second insulation patterns 175 and 310 may include an oxide, e.g., silicon oxide. Each of the second and fourth insulation patterns 185 and 320 may not include an oxide, and/or each of the first and second insulation patterns 175 and 310 may not include a nitride; however, example embodiments are not limited thereto.

The second capping pattern 380 may extend in the first direction to overlap the gate structure 160 in the vertical direction between neighboring ones of the bit line structures 295 in the first direction, and may partially cover an outer sidewall of the spacer structure on the sidewall of the bit line structure 295 in the first direction. In some example embodiments, a plurality of second capping patterns 380 may be spaced apart from each other in the second direction. The second capping pattern 380 may include a nitride, e.g., silicon nitride.

The contact plug structure may include a lower contact plug 375, an ohmic contact pattern 405, a barrier layer 410 and an upper contact plug 425 that are sequentially stacked in the vertical direction.

The lower contact plug 375 may be formed on the third recess 360 on the active pattern 105 and the isolation pattern 110 between the bit line structures 295 neighboring in the first direction and the second capping patterns 380 neighboring in the second direction, and may contact an outer sidewall of the third spacer 355 of the spacer structure and a sidewall of each of the second capping patterns 380. Thus, a plurality of lower contact plugs 375 may be formed to be spaced apart from each other in each of the first and second directions. In some example embodiments, an uppermost surface of the lower contact plug 375 may be lower than an uppermost surface of the third spacer 355.

The lower contact plug 375 may include, e.g., polysilicon doped with impurities such as at least one of boron, phosphorus, or arsenic. In some example embodiments, an air gap and/or an air seam (not shown) may be formed in the lower contact plug 375.

The ohmic contact pattern 405 may be formed on the lower contact plug 375. The ohmic contact pattern 405 may include a salicide, e.g., at least one of cobalt silicide (CoSi), nickel silicide (NiSi), etc.

The barrier layer 410 may be formed on an upper surface of the ohmic contact pattern 405 and a sidewall and an upper surface of the fourth spacer 395. The barrier layer 410 may include a metal nitride, e.g., at least one of titanium nitride, tantalum nitride, tungsten nitride, etc.

The upper contact plug 425 may be formed on the barrier layer 410. An upper surface of the upper contact plug 425 may be higher than upper surfaces of the bit line structure 295 and the second capping pattern 380.

In some example embodiments, the upper contact plugs 425 may be arranged in a honeycomb pattern, e.g. a regular hexagonal lattice or an irregular hexagonal lattice, in a plan view. Each of the upper contact plugs 425 may have a shape of a circle, an ellipse, or a polygon such as a rectangle or square in a plan view. The upper contact plug 425 may include a low resistance metal, e.g., at least one of tungsten, aluminum, copper, etc.

The insulating interlayer structure 470 may partially penetrate through an upper portion of the contact plug structure, an upper portion of the spacer structure, and an upper portion of the bit line structure 295, and a plurality of upper contact plugs 425 may be spaced apart from each other in each of the first and second directions. The insulating interlayer structure 470 may include first to third insulating interlayers 440, 450 and 460.

The first insulating interlayer 440 may contact upper surfaces of and upper sidewalls of the first and third spacers 305 and 355. The second insulating interlayer 450 may be formed on the first insulating interlayer 440, and a lower surface of the second insulating interlayer layer 450 may cover the top of the air spacer 335. Thus, the first insulating interlayer layer 440 may cover a sidewall of the second insulating interlayer layer 450, however, the first insulating interlayer layer 440 and the second insulating interlayer layer 450 may be separated from each other in the first direction at the top of the air spacer 335, and a lowermost surface of the first insulating interlayer layer 440 may be covered by the second insulating interlayer layer 450.

In some example embodiments, a portion of the second insulating interlayer layer 450 covering the lowermost surface of the first insulating interlayer layer 440 may have an X-shaped cross section.

In some example embodiments, the lower surface of the second insulating interlayer layer 450 may be higher than the upper surface of the metal pattern 275 of the bit line structure 295.

Each of the first and second insulating interlayer layers 440 and 450 may have a thickness gradually decreasing from top to bottom. Thus, thicknesses of uppermost portions of the first and second insulating interlayer layers 440 and 450 may be greater than thicknesses of lowermost portions thereof, respectively. In some example embodiments, a second ratio of the thickness of the lowermost portion of the second insulating interlayer 450 to the thickness of the uppermost portion thereof may be greater than a first ratio of the thickness of the lowermost portion of the first insulating interlayer 440 to the thickness of the uppermost portion thereof. In some example embodiments, the first ratio may be equal to or more than about 35% and equal to or less than about 40%, and the second ratio may be more than about 40% and equal to or less than about 70%.

The third insulating interlayer 460 may be formed on the second insulating interlayer 450, and a lower surface and a sidewall of the third insulating interlayer layer 460 may be covered by the second insulating interlayer 450.

The first insulating interlayer 440 may include a first insulation material, and the second insulating interlayer 450 may include a second insulation material different from or not included in the first insulation material. The third insulating interlayer 460 may include a third insulation material. In some example embodiments, the first insulation material may include, e.g., silicon carbonitride (SiCN) having low gap filling characteristics and may not include silicon nitride (SiN), the second insulation material may include, e.g., silicon nitride (SiN) and may not include SiCN, and the third insulation material may include, e.g., silicon nitride having higher gap filling characteristics than either or both of the first and second insulation materials.

The capacitor 540 may include a lower electrode 510, a dielectric layer 520, and an upper electrode 530 sequentially stacked on the upper contact plug 425. The lower and upper electrodes 510 and 530 may include doped polysilicon and/or a metal, e.g., aluminum, zirconium, titanium, hafnium, etc., and may include the same or different materials. The dielectric layer 520 may include, e.g., an oxide such as at least one of silicon oxide, a metal oxide, and/or a nitride such as silicon nitride.

The etch stop layer 500 may be formed between the insulating interlayer structure 470 and the dielectric layer 520, and may include a nitride, e.g., silicon nitride.

The fourth insulating interlayer 550 may be formed on the insulating interlayer structure 470, and may cover the capacitor 540. The insulating interlayer structure 470 may include an oxide, e.g., silicon oxide.

In the semiconductor device, the second insulating interlayer 450 covering the top of the air spacer 335 may be formed to have the lower surface higher than the upper surface of the metal pattern 275 of the bit line structure 295. The top of the air spacer 335 may be formed by the insulating insulation structure 460 having bread-loafed/kissing features. Thus, a vertical cross-sectional area of the air spacer 335 facing the sidewall of the bit line structure 295 may have a sufficiently large size, and a bit line loading capacity (CBL) may be effectively reduced, e.g. may be reduced based on the dielectric constant of air and/or the thickness of the air spacer 355.

Additionally, a cell sensing margin may be increased through the CBL reduction, and thus characteristics of the semiconductor device may be improved.

FIGS. 4 to 19 are plan views and cross-sectional views illustrating a method of manufacturing a semiconductor device according to some example embodiments. Specifically, FIGS. 4, 6, 9 and 13 are the plan views, and FIGS. 5, 7, 10-12 and 14-18 are the cross-sectional views. Each of FIGS. 5, 7, 10-12 and 14-18 includes cross-sections taken along lines A-A' and B-B' of a corresponding plan view, and FIG. 19 is an enlarged cross-sectional view of region X of FIG. 18.

Figure 4:
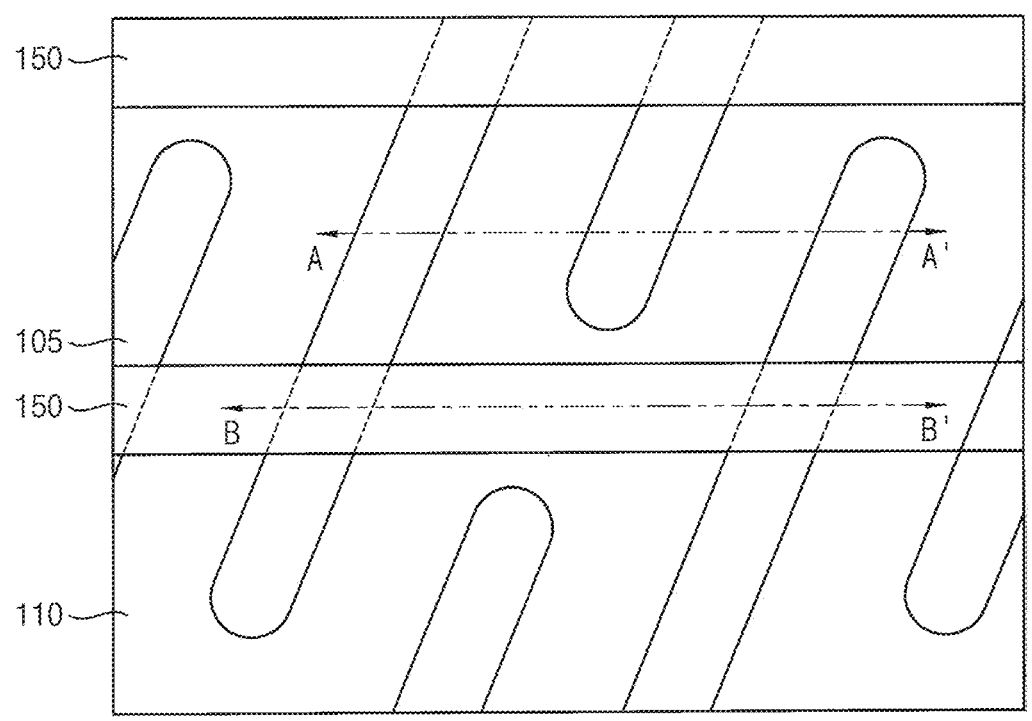
FIGS. 4 to 19 are plan views and cross-sectional views illustrating a method of manufacturing a semiconductor device according to some example embodiments.
Figure 4:
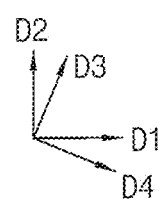
Figure 5:
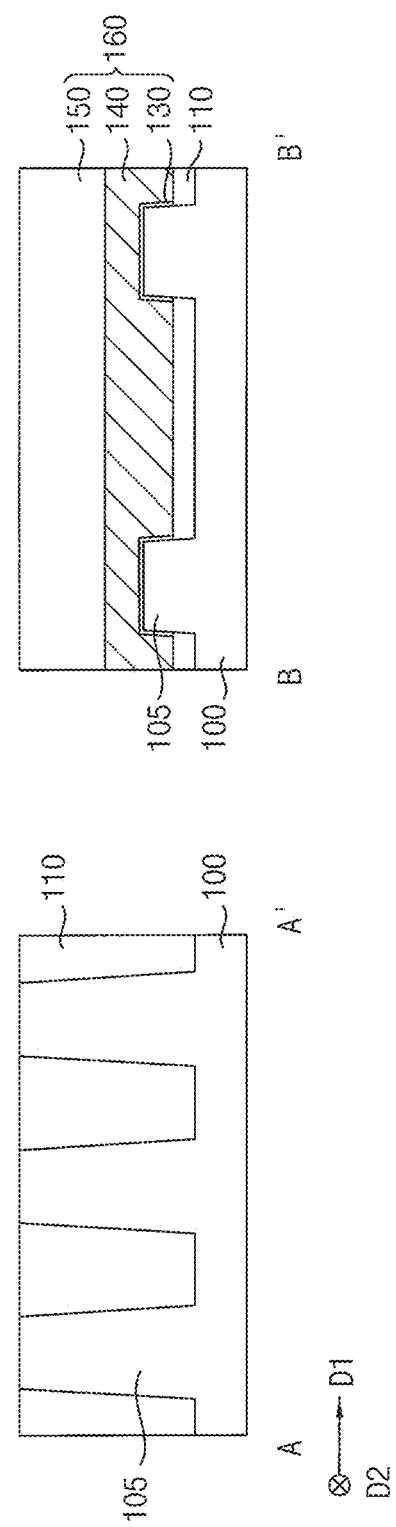

Referring to FIGS. 4 and 5, active patterns 105 may be formed on a substrate 100, and an isolation pattern 110 may be formed to cover sidewalls of the active patterns 105.

A beamline and/or a plasma-assisted doping ion implantation process may be performed on the substrate 100 to form an impurity region (not shown), and the active pattern 105 and the isolation pattern 110 may be partially etched to form a first recess extending in the first direction.

A gate structure 160 may be formed/within in the first recess. The gate structure 160 may include a gate insulation layer 130 on a surface of the active pattern 105 exposed by the first recess and formed with a deposition process and/or grown with an oxidation process such as a thermal oxidation process and/or an in-situ steam generation (ISSG) process, a gate electrode 140 on the gate insulation layer 130 to fill a lower portion of the first recess, and a gate mask 150 on the gate electrode 140 to fill an upper portion of the first recess. The gate structure 160 may extend in the first direction, and a plurality of gate structures 160 may be spaced apart from each other in the second direction.

In some example embodiment, the gate insulation layer 130 may be formed by performing a thermal oxidation process and/or an ISSG process on the surface of the active pattern 105 exposed by the first recess. Alternatively or additionally, the insulation layer 130 may be formed by depositing an insulating material, e.g., silicon oxide on the first recess.

Figure 6:
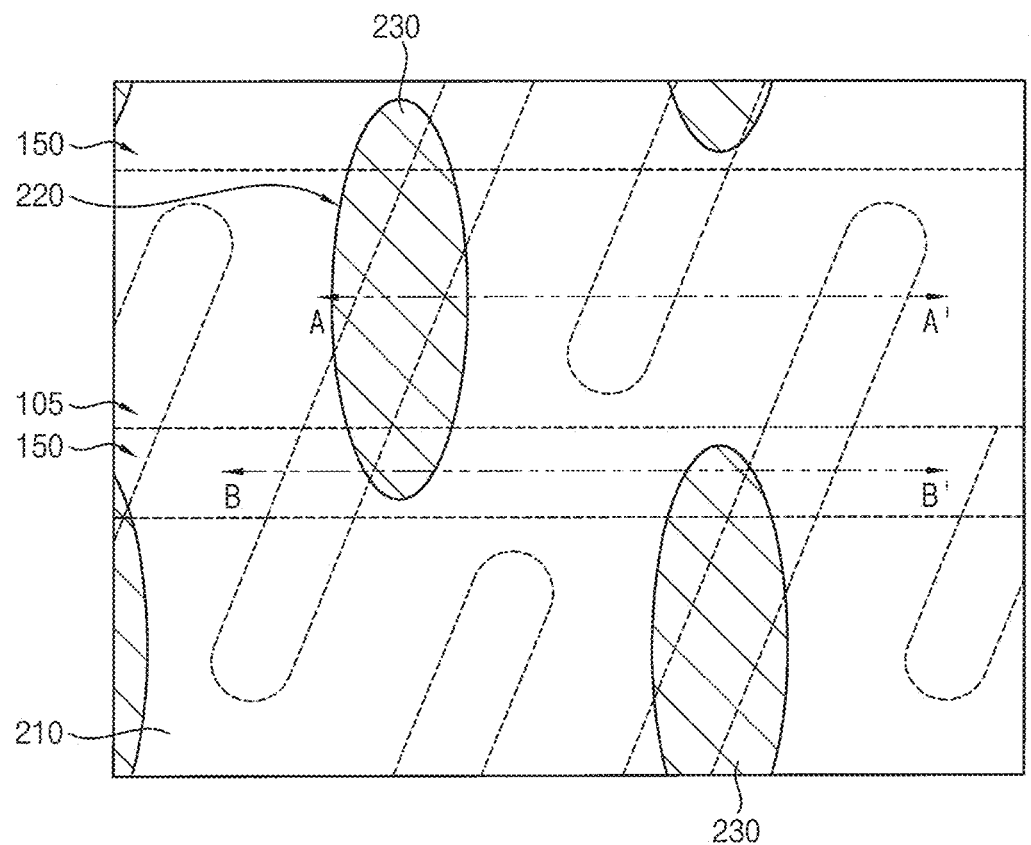
Figure 7:
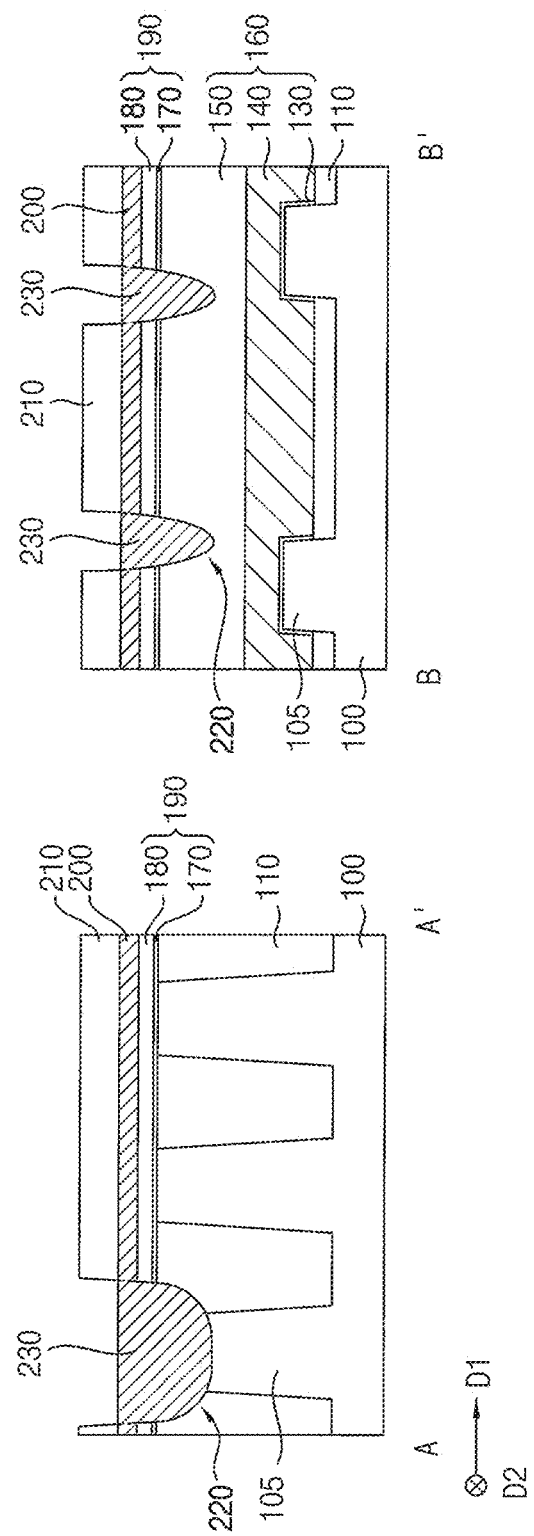

Referring to FIGS. 6 and 7, an insulation layer structure 190, a first conductive layer 200 and a first mask 210 may be sequentially formed on the substrate 100, and the first conductive layer 200 and the insulation layer structure 190 may be etched using the first mask 210 as an etching mask to form a first hole 220 exposing the active pattern 105.

In some example embodiments, the insulation layer structure 190 may include first and second insulation layers 170 and 180 sequentially stacked.

The first conductive layer 200 may include, e.g., polysilicon doped with n-type impurities such as arsenic and/or phosphorus.

The first mask 210 may include a nitride, e.g., silicon nitride.

During the etching process, upper portions of the active pattern 105 and the isolation pattern 110 adjacent thereto exposed by the first hole 210, and an upper portion of the gate mask 150 may be also etched to form a second recess. For example, a bottom of the first hole 220 may be referred to as a second recess 220.

In some example embodiments, the first hole 220 may expose a middle upper surface of each of the active patterns 105 extending in the third direction, and thus a plurality of first holes 220 may be formed in each of the first and second directions.

A second conductive layer 230 may be formed to fill the first hole 220.

In some example embodiments, the second conductive layer 230 may be formed by forming a preliminary second conductive layer on the active pattern 105, the isolation pattern 110, the gate mask 150 and the first mask 210 to fill the first hole 220, and removing an upper portion of the preliminary second conductive layer through a chemical mechanical planarization (CMP) process and/or an etch back process. Thus, the second conductive layer 230 may have an upper surface substantially coplanar with an upper surface of the first conductive layer 200.

In some example embodiments, a plurality of second conductive layers 230 may be spaced apart from each other in each of the first and second directions. The second conductive layer 230 may include, for example, polysilicon doped with impurities such as at least one of boron, phosphorus, or arsenic, and may be merged to (e.g. contiguous with or homogenous with) the first conductive layer 200.

Figure 8:
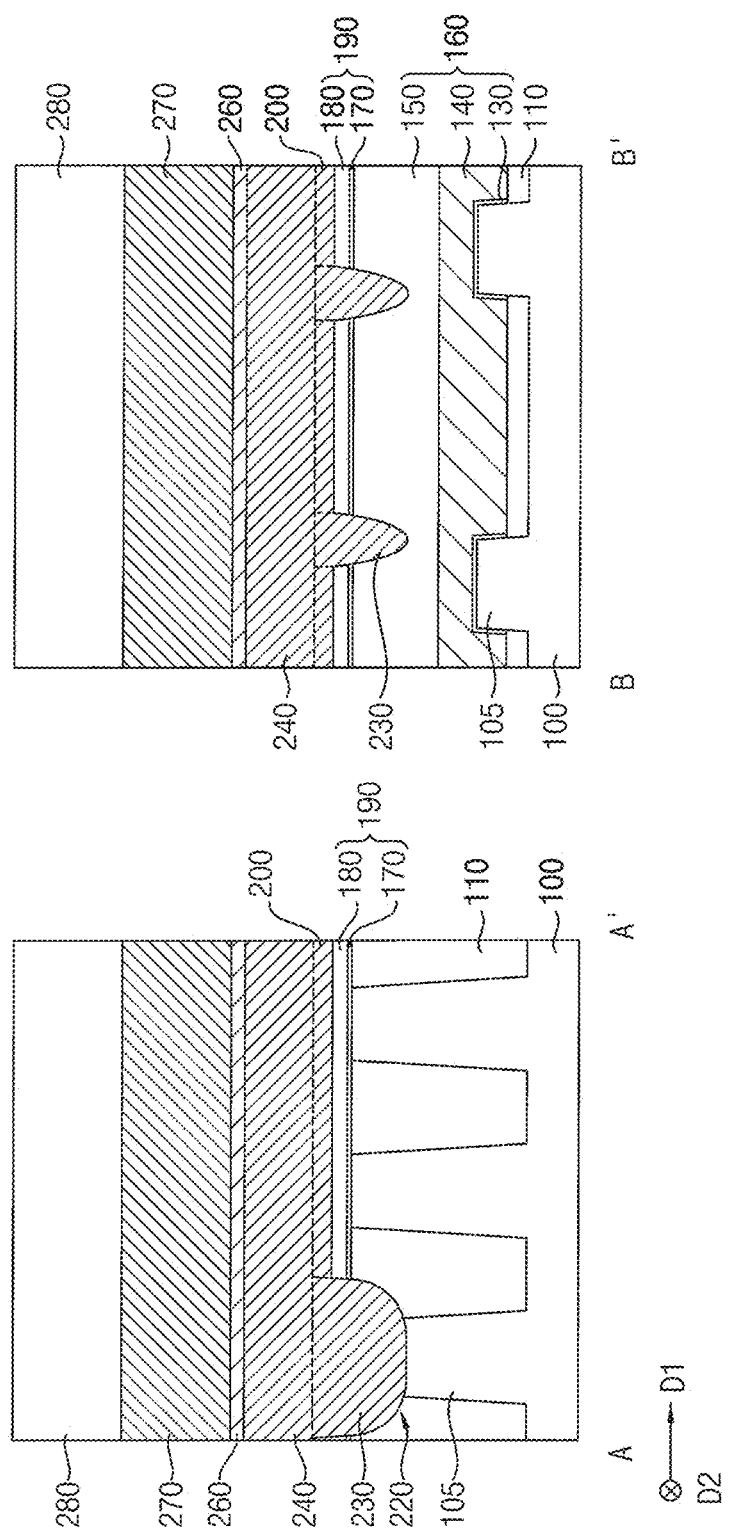

Referring to FIG. 8, after removing the first mask 210, a third conductive layer 240, a diffusion barrier layer 260, a metal layer 270 and a first capping layer 280 may be sequentially formed on the first and second conductive layers 200 and 230.

The third conductive layer 240 may include polysilicon doped with impurities such as at least one of boron, phosphorus, or arsenic at the same or different concentrations than that of the second conductive layer 230 and/or the first conductive layer 200, and may be merged with the first and second conductive layers 200 and 230.

Referring to FIGS. 9 and 10, the first capping layer 280 may be patterned to form a first capping pattern 285, and the metal layer 270, the diffusion barrier layer 260, the third conductive layer 240, and the first and second conductive layers 200 and 230 may be sequentially etched using the first capping pattern 285 as an etching mask.

In some example embodiments, the first capping pattern 285 may extend in the second direction on the substrate 100, and a plurality of first capping patterns 285 may be formed to be spaced apart from each other in the first direction.

By the etching process, a second conductive pattern 235, a third conductive pattern 245, a diffusion barrier 265, a metal pattern 275 and the first capping pattern 285 that are sequentially stacked may be formed on the active pattern 105, the isolation pattern 110 and the gate mask 150 in the first hole 220, and a first conductive pattern 205, the third conductive pattern 245, the diffusion barrier 265, the metal pattern 275, and the first capping pattern 285 may be sequentially stacked on the second insulation layer 180 of the insulation layer structure 190 at an outside of the first hole 220.

As illustrated above, the first to third conductive layers 200, 230 and 240 may be merged with (e.g. contiguous with) each other, and thus the second and third conductive patterns 235 and 245 sequentially stacked and the first and third conductive patterns 205 and 245 sequentially stacked may each form one polysilicon pattern 255. There may be a thermal process such as an annealing process/laser annealing process that may form one polysilicon pattern 255 based on the first to third conductive layers 200, 230, and 240. The polysilicon pattern 255, the diffusion barrier 265 and the metal pattern 275 that are sequentially stacked may form a conductive structure 277. Hereinafter, the conductive structure 277 and the first capping pattern 285 sequentially stacked may be referred to as a bit line structure 295.

In some example embodiments, the bit line structure 295 may extend in the second direction on the substrate 100, and a plurality of bit line structures 295 may be spaced apart from each other in the first direction. Each of the bit line structures 295 may contact a middle portion in the third direction of each of the active patterns 105 through the first hole 220 located in the middle portion of the active patterns 105, and thus may be electrically connected thereto.

Figure 11:
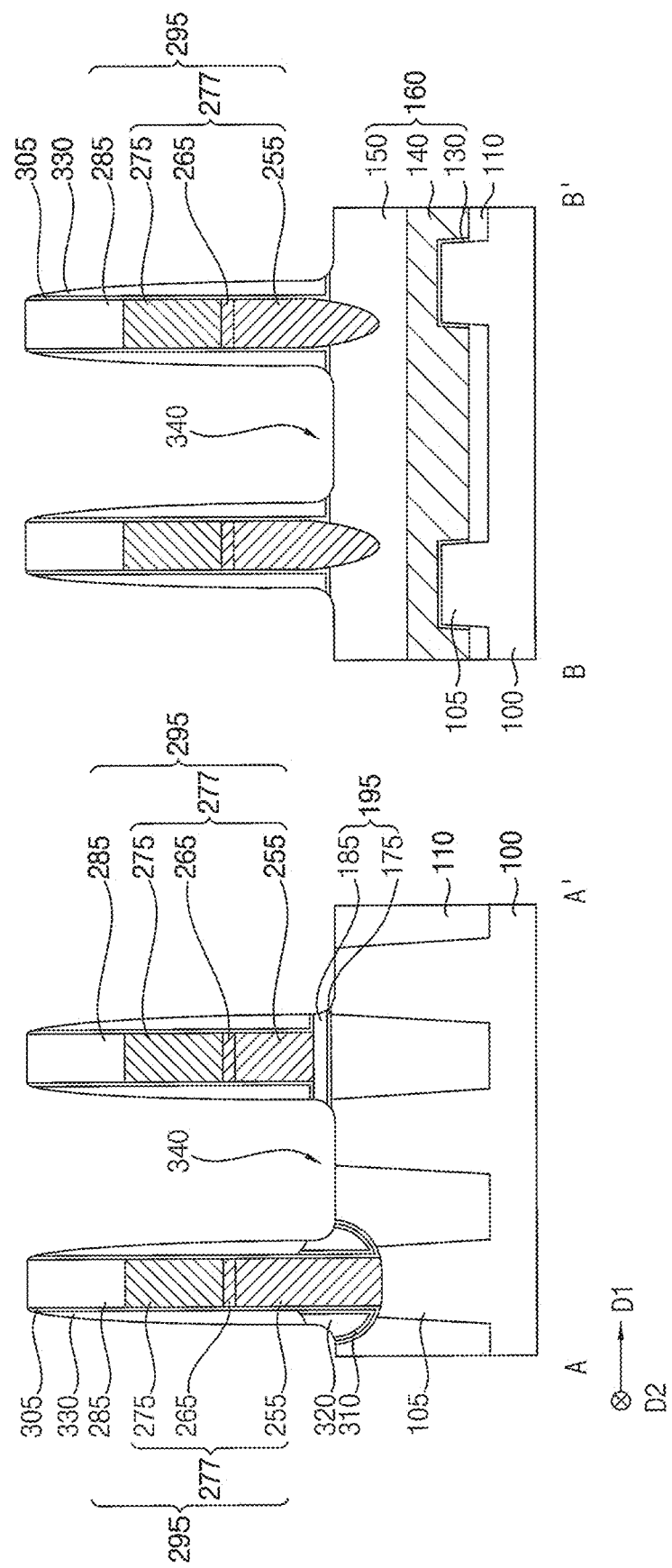

Referring to FIG. 11, a first spacer layer may be formed on upper surfaces of the active pattern 105, the isolation pattern 110 and the gate mask 150 exposed by the first hole 220, a sidewall of the first hole 220, and the second insulation layer 180 to cover the bit line structure 295. Third and fourth insulation layers may be sequentially formed on the first spacer layer, and the fourth insulation layer may be formed to fill the first hole 220.

The third and fourth insulation layers may be etched by an etching process. In some example embodiments, the etching process may be performed by a wet etch process such as a process using an acid such as buffered hydrogen fluoride and/or phosphoric acid, and other portions of the third and fourth insulation layers except for a portion in the first hole 220 may be removed. Thus, most of an entire surface of the first spacer layer, for example, an entire surface except for a portion thereof in the first hole 220 may be exposed, and portions of the third and fourth insulation layers remaining in the first hole 220 may form third and fourth insulation patterns 310 and 320, respectively.

A second spacer layer may be formed on the exposed surface of the first spacer layer and the third and fourth insulation patterns 310 and 320 in the first hole 220, and may be anisotropically etched to form a second spacer 330 on the surface of the first spacer layer and the third and fourth insulation patterns 310 and 320 to cover a sidewall of the bit line structure 295.

The second spacer layer may include an oxide, e.g., silicon oxide.

A dry etching process such as a reactive ion etching (RIE) process may be performed using the first capping pattern 285 and the second spacer 330 as an etching mask to form a first opening 340 exposing the upper surface of the active pattern 105. The upper surface of the isolation pattern 110 and the upper surface of the gate mask 150 may be also exposed by the first opening 340.

By the dry etching process, portions of the first spacer layer on upper surfaces of the first capping pattern 285 and the second insulation layer 180 may be removed, and thus a first spacer 305 covering the sidewall of the bit line structure 295 may be formed. Additionally or alternatively, during the dry etching process, the first and second insulation layers 170 and 180 may be partially removed, such that first and second insulation patterns 175 and 185 may remain under the bit line structure 295. The first and second insulation patterns 175 and 185 that are sequentially stacked under the bit line structure 295 may form an insulation pattern structure.

Figure 12:
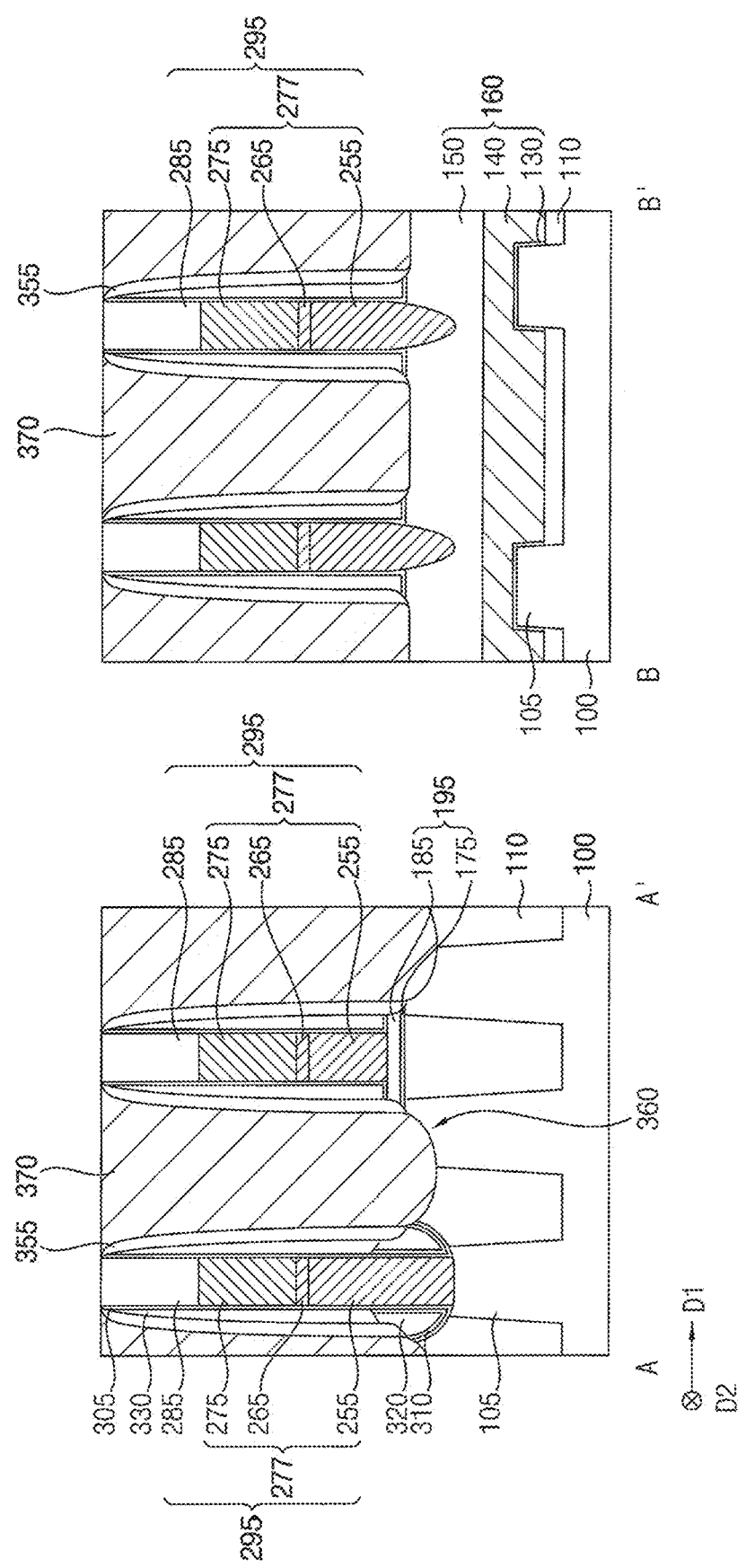

Referring now to FIG. 12, a third spacer layer may be formed on the upper surface of the first capping pattern 285, an outer sidewall of the second spacer 330, portions of upper surfaces of the third and fourth insulation patterns 310 and 320, and the upper surfaces of the active pattern 105, the isolation pattern 110 and the gate mask 150 exposed by the first opening 340, and may be etched, e.g. anisotropically etched, to form a third spacer 355 covering the sidewall of the bit line structure 295.

The first to third spacers 305, 330 and 355 sequentially stacked in a horizontal direction substantially parallel to the upper surface of the substrate 100 from the sidewall of the bit line structure 295 on the substrate 100 may be referred to as a preliminary spacer structure.

An upper portion of the active pattern 105 may be removed by an etching process to form a third recess 360 connected to the first opening 340.

A lower contact plug layer 370 may be formed to fill the first opening 340 and the third recess 360 on the substrate 100, and an upper portion of the lower contact plug layer 370 may be planarized until the upper surface of the first capping pattern 285 is exposed. The lower contact plug layer 370 may be formed with a chemical vapor deposition (CVD) process and/or a physical vapor deposition (PVD) process.

In some example embodiments, the lower contact plug layer 370 may extend in the second direction, and a plurality of lower contact plug layers 370 may be formed to be spaced apart from each other in the first direction by the bit line structures 295.

Figure 13:
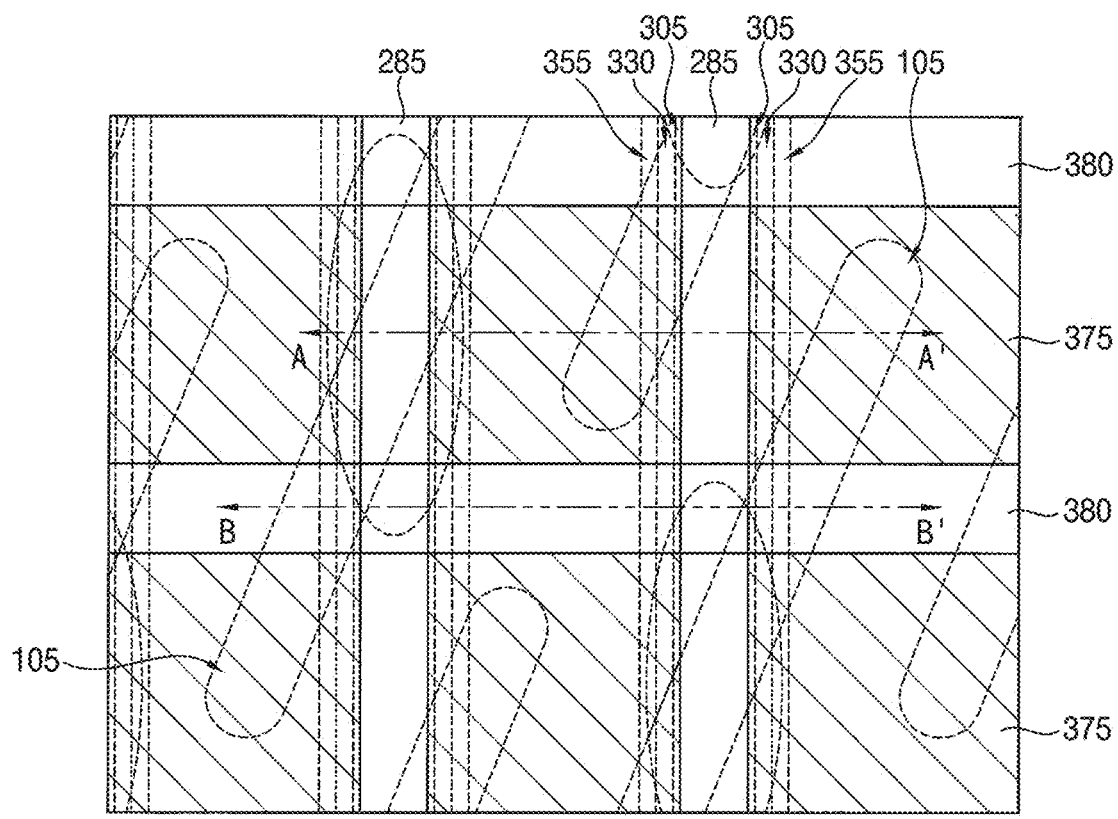
Figure 13:
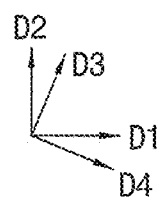
Figure 14:
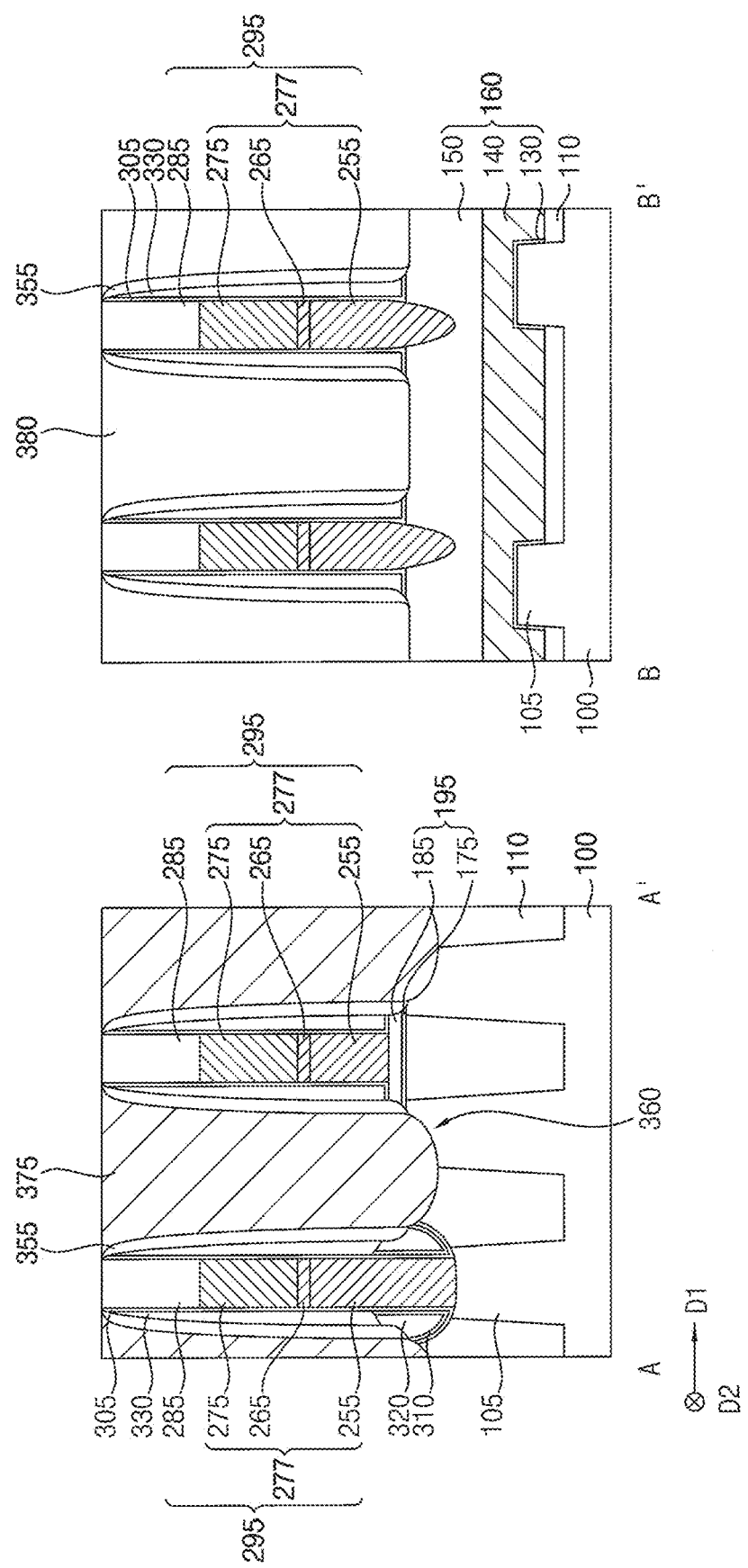

Referring to FIGS. 13 and 14, a second mask (not shown) including second openings, each of which may extend in the first direction, spaced apart from each other in the second direction may be formed on the first capping pattern 285 and the lower contact plug layer 370, and the lower contact plug layer 370 may be etched using the second mask as an etching mask.

In some example embodiments, each of the second openings may overlap the gate structure 160 in a vertical direction substantially perpendicular to the upper surface of the substrate 100. By the etching process, a third opening may be formed to expose the upper surface of the gate mask 150 of the gate structure 160 between the bit line structures 295 on the substrate 100.

After removing the second mask, a second capping pattern 380 may be formed on the substrate 100 to fill the third opening. The second capping pattern 380 may include a nitride, e.g., silicon nitride. In some example embodiments, the second capping pattern 380 may extend in the first direction between the bit line structures 295, and a plurality of second capping patterns 380 may be formed in the second direction.

Thus, the lower contact plug layer 370 extending in the second direction between the bit line structures 295 may be divided into a plurality of lower contact plugs 375 spaced apart from each other in the second direction by the second capping patterns 380. Each of the lower contact plugs 375 may contact a corresponding one of opposite ends in the third direction of a corresponding one of the active patterns 105, and may be electrically connected thereto.

Figure 15:
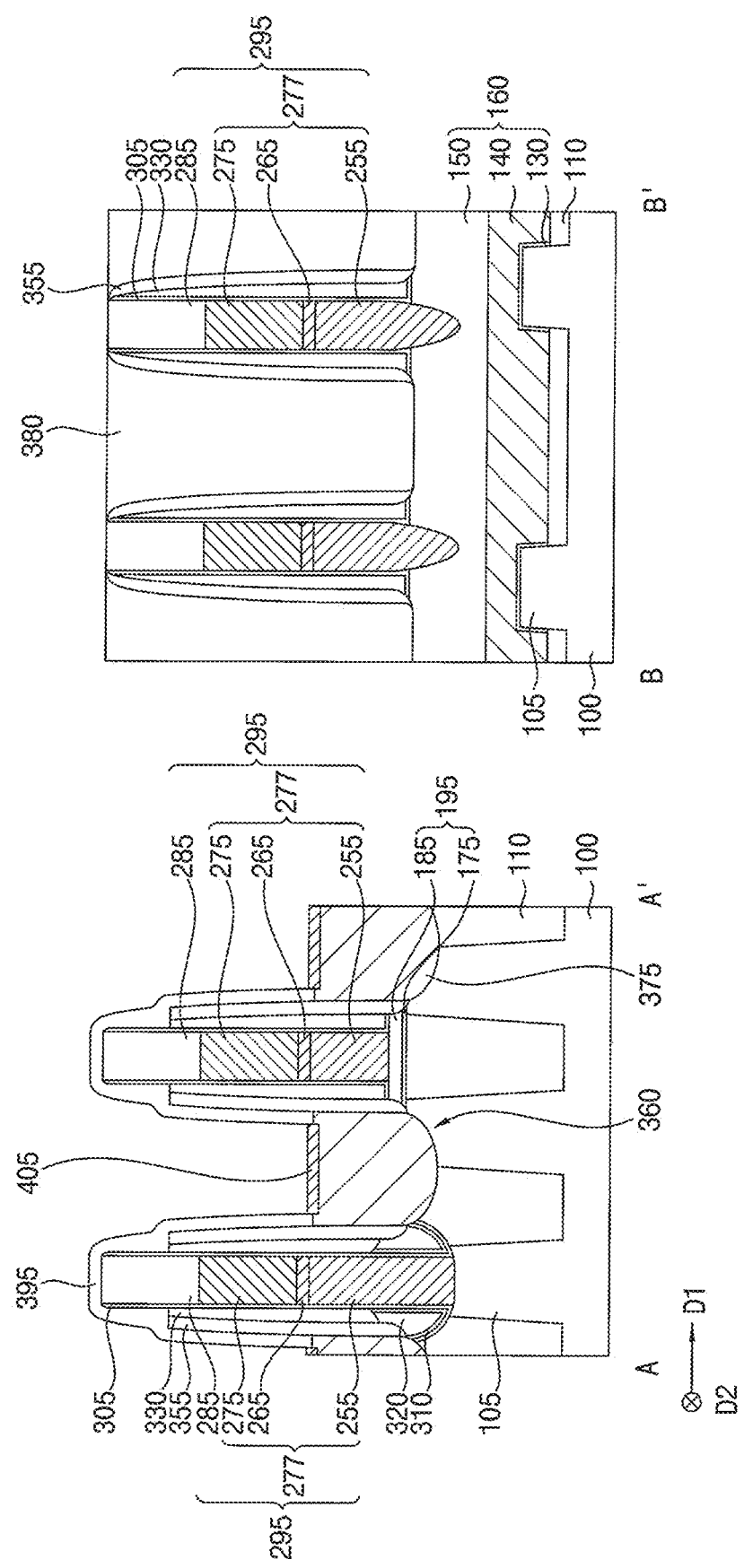

Referring to FIG. 15, an upper portion of the lower contact plug 375 may be removed to expose an upper portion of the preliminary spacer structure on the sidewall of the bit line structure 295, and upper portions of the second and third spacers 330 and 355 of the exposed preliminary spacer structure may be removed.

An upper portion of the lower contact plug 375 may be further removed by, e.g., an etch back process. Thus, the upper surface of the lower contact plug 375 may be lower than uppermost surfaces of the second and third spacers 330 and 355.

A fourth spacer layer may be formed on the bit line structure 295, the preliminary spacer structure, the second capping pattern 380, and the lower contact plug 375, and may be etched, e.g. anisotropically etched so that a fourth spacer 395 may be formed to cover the first to third spacers 305, 330, 355 on each of opposite sidewalls of the bit line structure 295 in the first direction and that an upper surface of the lower contact plug 375 may not be covered by the fourth spacer 375 but be exposed.

An ohmic contact pattern 405 may be formed on the exposed upper surface of the lower contact plug 375. In some example embodiments, the ohmic contact pattern 405 may be formed by forming a metal layer on the lower contact plug 375, the fourth spacer 395, and the first and second capping patterns 285 and 380, thermally treating the metal layer, and removing an unreacted portion of the metal layer.

Figure 16:
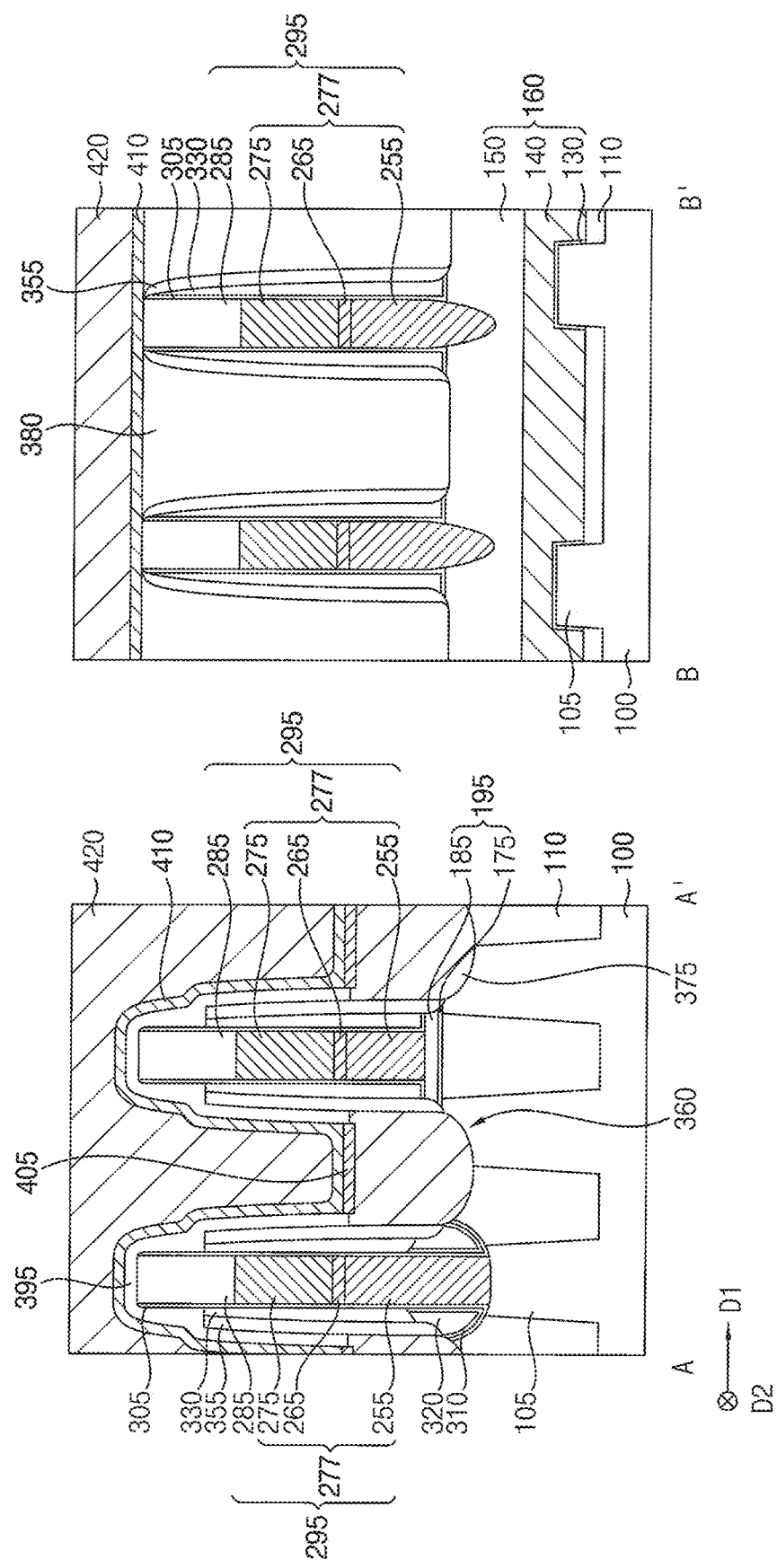

Referring to FIG. 16, a barrier layer 410 may be formed on the fourth spacer 395, the ohmic contact pattern 405, and the first and second capping patterns 285 and 380, an upper contact plug layer 420 may be formed on the barrier layer 410 to fill a space between the bit line structures 295, and an upper portion of the upper contact plug layer 420 may be planarized.

In some example embodiments, an upper surface of the upper contact plug layer 420 may be higher than upper surfaces of the first and second capping patterns 285 and 380.

Figure 17:
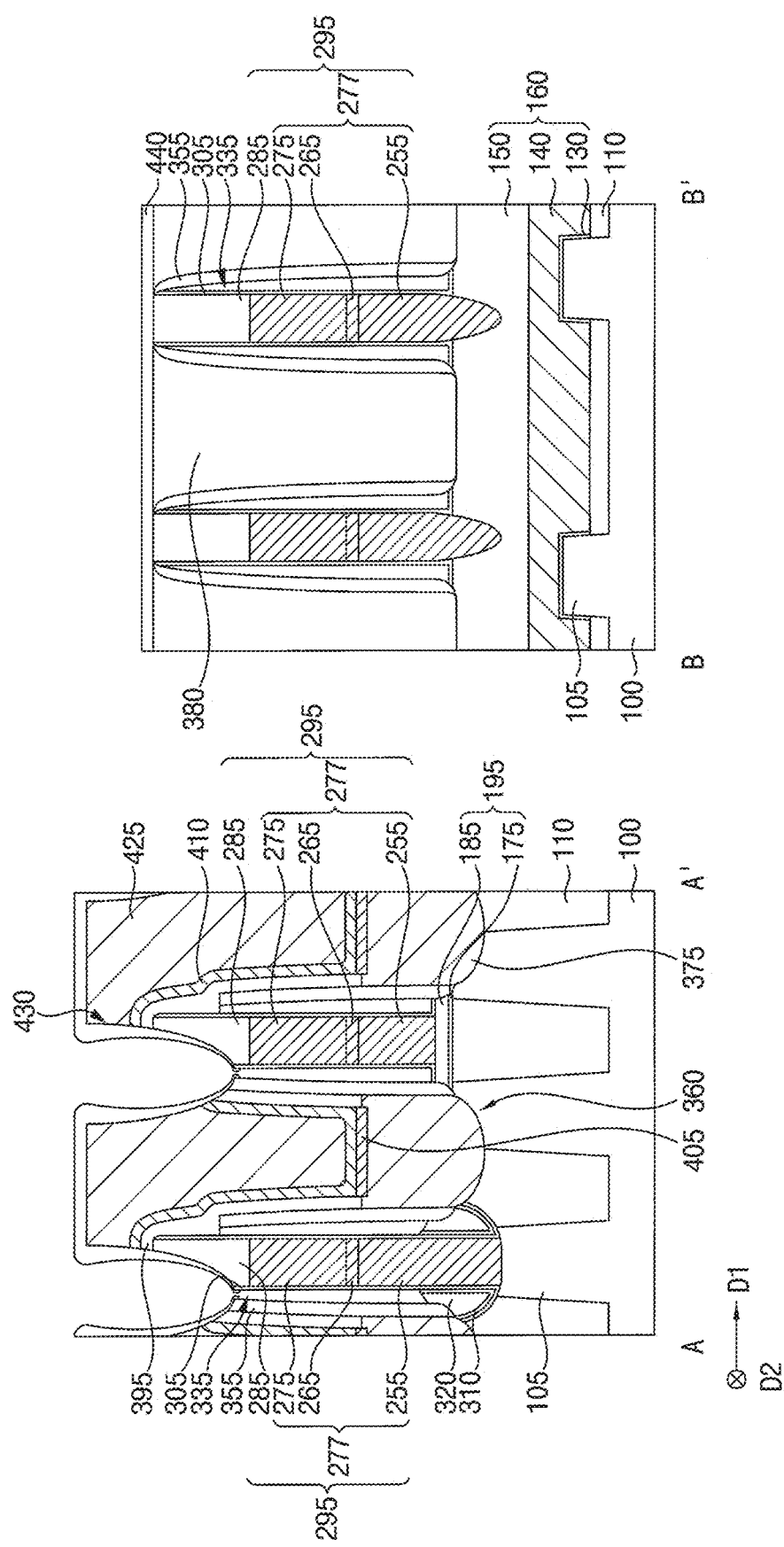

Referring to FIG. 17, an upper portion of the upper contact plug layer 420, a portion of the barrier layer 410, an upper portion of the first capping pattern 285, and upper portions of the first to fourth upper spacers 305, 330, 355 and 395 may be removed to form a second hole 430.

As the second hole 430 is formed, the upper contact plug layer 420 may be transformed into an upper contact plug 425. In some example embodiments, a plurality of upper contact plugs 425 may be formed to be spaced apart from each other in each of the first and second directions, and may be arranged in a honeycomb pattern in a plan view. Each of the upper contact plugs 425 may have a shape of a circle, ellipse, or polygon such as a square or a rectangle in a plan view, and may have the same, or different, shapes and/or sizes.

The lower contact plug 375, the ohmic contact pattern 405, the barrier layer 410, and the upper contact plug 425 sequentially stacked on the substrate 100 may form a contact plug structure.

The exposed second upper spacer 330 may be removed to form an air gap 335 connected to the second hole 430. The second spacer 330 may be removed by, e.g., an isotropic process such as a wet etching process.

In some example embodiments, not only a portion of the second upper spacer 330 on the sidewall of the bit line structure 295 extending in the second direction directly exposed by the second hole 430 but also other portions of the second upper spacer 330 parallel to the directly exposed portion thereof in the horizontal direction may be removed. For example, not only the portion of the second upper spacer 330 exposed by the second hole 430 not to be covered by the upper contact plug 425 but also a portion of the second upper spacer 330 adjacent to the exposed portion in the second direction to be covered by the second capping pattern 380 and a portion of the second upper spacer 330 adjacent to the exposed portion in the second direction to be covered by the upper contact plug 425 may be all removed.

A first insulating interlayer 440 may be formed on the second hole 430, the upper contact plug 425 and the second capping pattern 380.

The first insulating interlayer 440 may be formed through, e.g., a chemical vapor deposition (CVD) process.

The CVD process may include, at least one of e.g., an atmospheric pressure chemical vapor deposition (APCVD) process, a low pressure chemical vapor deposition (LPCVD) process, a plasma enhanced chemical vapor deposition (PECVD) process, or a high density plasma chemical vapor deposition (HDPCVD) process.

In some example embodiments, the first insulating interlayer 440 may include silicon carbonitride (SiCN) having a low gap filling characteristic, and thus may be hardly formed or may not be formed in the air gap 335 and may be partially formed only on an upper sidewall of the air gap 335. For example, the first insulating interlayer 440 may be divided into two parts in the first direction at a top of the air gap 335.

In some example embodiments, a portion of the first insulating interlayer 440 that may be formed on the second hole 430 may have a thickness gradually decreasing from top to bottom. In some example embodiments, at the portion of the first insulating interlayer 440 in the second hole 430, a ratio of a thickness of a lowermost portion to a thickness of an uppermost portion may be equal to or more about than 35% and equal to or less than about 40%.

Figure 18:
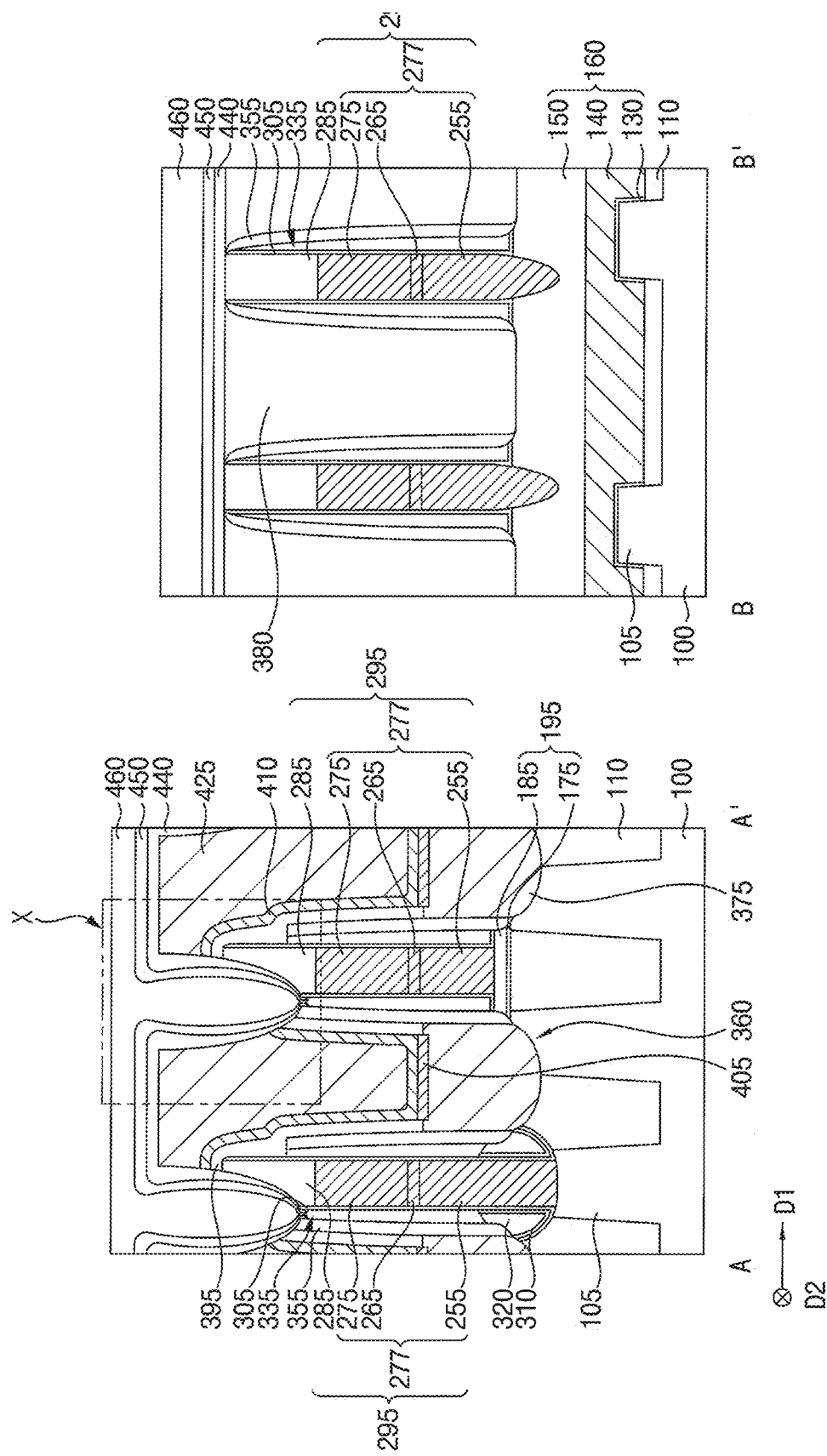
Figure 19:
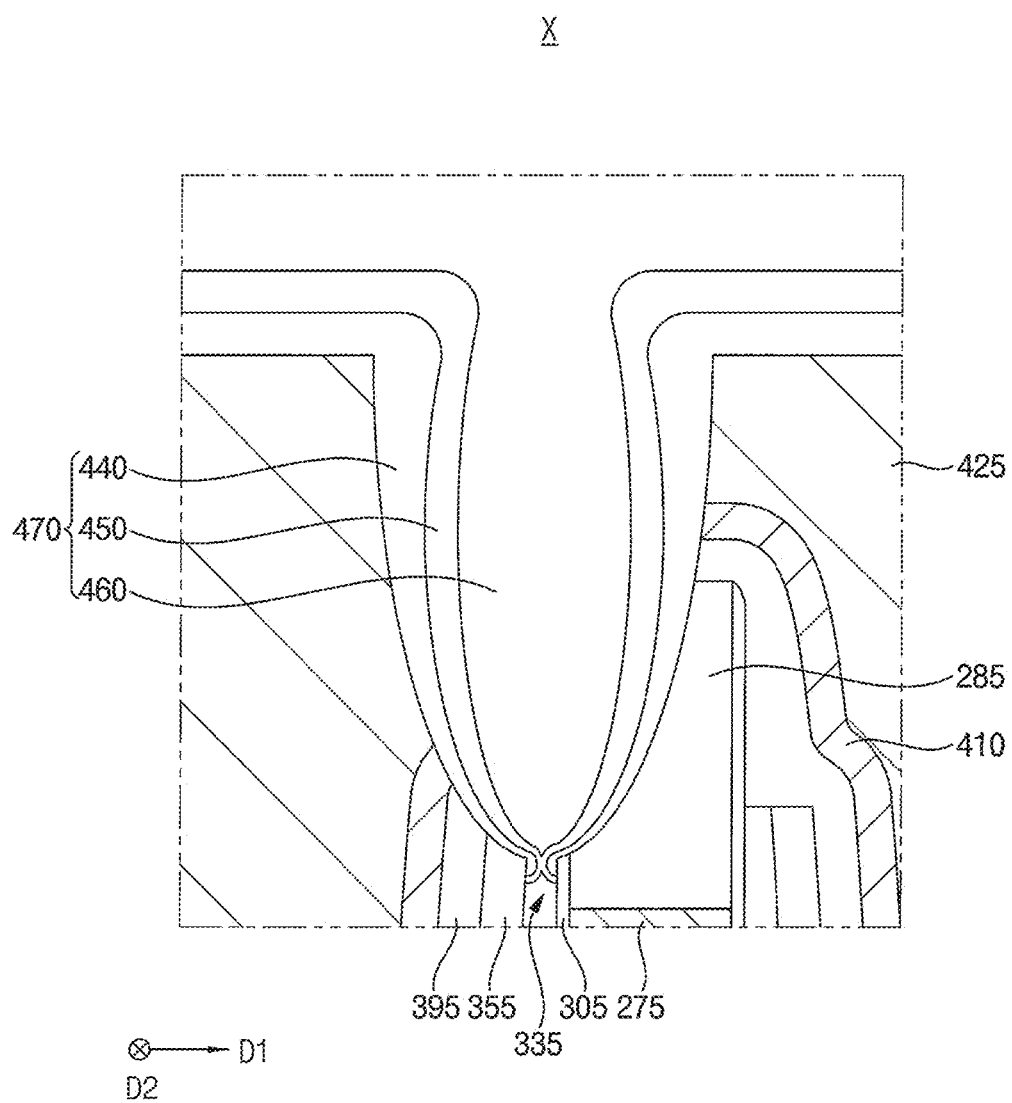

Referring now to FIGS. 18 and 19, a second insulating interlayer 450 may be formed on the first insulating interlayer 440, and a third insulating interlayer 460 may be formed on the second insulating interlayer 450 to fill the second hole 430. Each of the second and third insulating interlayers 450 and 460 may be formed through an atomic layer deposition (ALD) to have higher gap filling characteristic than that of the first insulating interlayer 440.

A portion of the second insulating interlayer 450 that may be formed on the second hole 430 may have a thickness gradually decreasing from top to bottom. In some example embodiments, at the portion of the second insulating interlayer 450 in the second hole 430, a ratio of a thickness of a lowermost portion to a thickness of an uppermost portion may be more than about 40% and equal to or less than about 70%.

In some example embodiments, the second insulating interlayer 450 may cover a lowermost surface of the first insulating interlayer 440, and a lower surface of the second insulating interlayer 450 may cover the top of the air gap 335. That is, an entrance of the top of the air gap 335 may be entirely blocked by the second insulating interlayer 450.

Thus, the air gap 335 under the second hole 430 might not be filled. The air gap 335 may be also referred to as an air seam/air spacer 335, and may form an spacer structure together with the first, third and fourth upper spacers 305, 355 and 395. For example, the air gap 335 may be a spacer including an air such as clean, dry air and may have a dielectric constant of air, such as 1.00059 or about 1.00059.

Referring back to FIGS. 1 and 2 again, portions of the first to third insulating interlayers 440, 450 and 460 that may be formed on an upper surface of the upper contact plug 425 may be removed by an etch back process and/or a CMP process. The first to third insulating interlayers 440, 450 and 460 may form an insulating interlayer structure 470.

A capacitor 540 may be formed to contact the upper surface of the upper contact plug 425; however, example embodiments are not limited thereto. For example, a structure other than a capacitor, such as a non-linear structure and/or a structure having a hysteresis behavior, may be formed to contact the upper surface of the upper contact plug 425.

Particularly, an etch stop layer 500 and a mold layer (not shown) may be sequentially formed on the upper contact plug 425 and the insulating interlayer structure 470, and partially etched to form a third hole partially exposing the upper surface of the upper contact plug 425.

A lower electrode layer (not shown) may be formed on a sidewall of the third hole, the exposed upper surface of the upper contact plug 425 and the mold layer, a sacrificial layer (not shown) may be formed on the lower electrode layer to fill the third hole, and the lower electrode layer and the sacrificial layer may be planarized until an upper surface of the mold layer is exposed to divide the lower electrode layer. The sacrificial layer and the mold layer may be removed by, e.g., a wet etching process, and thus a lower electrode 510 having a cylindrical shape or a tapered profile may be formed on the exposed upper surface of the upper contact plug 425. Alternatively, the lower electrode 460 may have a pillar shape filling the third hole.

A dielectric layer 520 may be formed on a surface of the lower electrode 510 and the etch stop layer 500, and an upper electrode 530 may be formed on the dielectric layer 520 so that the capacitor 540 including the lower electrode 510, the dielectric layer 520 and the upper electrode 530 may be formed.

A fourth insulating interlayer 550 may be formed to cover the capacitor 540 on the substrate 100 to complete the fabrication of the semiconductor device.

If the second insulating interlayer 450 is formed through a CVD process, the second insulating interlayer 450 might not entirely block the entrance of the top of the air gap 335. Additionally, if the third insulating interlayer 460 including an insulation material having a high gap filling characteristic is formed on the second insulating interlayer 450 through an ALD process, the third insulating interlayer 460 may partially penetrate through the air gap 335 to entirely block the entrance of the top of the air gap 335. The third insulating interlayer 460 may be formed to have the lower surface, which may be lower than the upper surface of the metal pattern 275 of the bit line structure 295, and thus the air gap 335 might not have a sufficiently large vertical cross-sectional area, so that the CBL may be great and the sensing margin may be reduced.

However, in some example embodiments, the second insulating interlayer 450 may be formed through the ALD process having a high gap filling characteristic, and thus the second insulating interlayer 450 may entirely block the entrance of the top of the air gap 335, and the lower surface of the second insulating interlayer 450 may be higher than the upper surface of the metal pattern 275 of the bit line structure 295. Thus, the air gap 335 may have a sufficiently large vertical cross-sectional area, so that the CBL may be further reduced.

While inventive concepts have been shown and described with reference to some example embodiments thereof, it will be understood by those of ordinary skill in the art that various changes in form and details may be made thereto without departing from the spirit and scope of inventive concepts as set forth by the following claims.

What is claimed is:

1. A semiconductor device comprising:
    an active pattern on a substrate;
    a gate structure in an upper portion of the active pattern;
    a bit line structure on the active pattern, the bit line structure including a conductive structure and a capping pattern that are stacked;
    a spacer structure on a sidewall of the bit line structure;
    a contact plug structure on the active pattern, the contact plug structure contacting the spacer structure;
    an insulating interlayer structure partially penetrating through upper portions of the contact plug structure, the spacer structure and the bit line structure; and
    a capacitor on the contact plug structure,
    wherein,
    the spacer structure includes an air spacer,
    the insulating interlayer structure includes,
        a first insulating interlayer, and
        a second insulating interlayer on the first insulating interlayer, the second insulating interlayer including an insulation material different from materials included in the first insulating interlayer,
    a lower surface of the second insulating interlayer covers a top of the air spacer, and a lowermost surface of the first insulating interlayer is higher than a lowermost surface of the second insulating interlayer.

2. The semiconductor device according to claim 1, wherein the first insulating interlayer includes silicon carbonitride (SiCN), and
the second insulating interlayer includes silicon nitride (SiN).

3. The semiconductor device according to claim 1, wherein the insulating interlayer structure further includes a third insulating interlayer on the second insulating interlayer, and the second insulating interlayer covers a lower surface of and a sidewall of the third insulating interlayer.

4. The semiconductor device according to claim 3, wherein the third insulating interlayer includes silicon nitride (SiN).

5. The semiconductor device according to claim 1, wherein a portion of the second insulating interlayer covering the top of the air spacer and the lowermost surface of the first insulating interlayer has an X-shaped cross section.

6. The semiconductor device according to claim 1, wherein the lower surface of the second insulating interlayer is higher than an upper surface of the conductive structure of the bit line structure.

7. The semiconductor device according to claim 1, wherein the conductive structure of the bit line structure includes a polysilicon pattern having impurities and a metal pattern sequentially stacked in a vertical direction perpendicular to an upper surface of the substrate.

8. The semiconductor device according to claim 1, wherein the spacer structure includes first, second and third spacers sequentially stacked from the sidewall of the bit line structure in a horizontal direction parallel to an upper surface of the substrate,
the second spacer defines the air spacer, and
the first and third spacers include a nitride.

9. The semiconductor device according to claim 8, wherein the first insulating interlayer contacts upper sidewalls of the first and third spacers.

10. A semiconductor device comprising:
an active pattern on a substrate;
a gate structure in an upper portion of the active pattern;
a bit line structure on the active pattern, the bit line structure including a conductive structure and a capping pattern that are stacked;
a spacer structure on a sidewall of the bit line structure;
a contact plug structure on the active pattern, the contact plug structure contacting the spacer structure;
an insulating interlayer structure partially penetrating through upper portions of the contact plug structure, the spacer structure and the bit line structure; and
a capacitor on the contact plug structure,
wherein,
the spacer structure includes an air spacer,
the insulating interlayer structure includes,
    a first insulating interlayer,
    a second insulating interlayer on the first insulating interlayer, and
    a third insulating interlayer on the second insulating interlayer,
a lower surface of the second insulating interlayer covers a top of the air spacer,
a lowermost surface of the first insulating interlayer is higher than a lowermost surface of the second insulating interlayer, and
a second ratio of a thickness of a lowermost portion of the second insulating interlayer to a thickness of an uppermost portion of the second insulating interlayer is greater than a first ratio of a thickness of a lowermost portion of the first insulating interlayer to a thickness of an uppermost portion first insulating interlayer, the respective thicknesses of the uppermost portions of the first and second insulating interlayers being greater than the respective thicknesses of the lowermost portions of the first and second insulating interlayers.

11. The semiconductor device according to claim 10, wherein the first insulating interlayer includes silicon carbonitride (SiCN), and
the second insulating interlayer includes silicon nitride (SiN).

12. The semiconductor device according to claim 11, wherein the third insulating interlayer includes silicon nitride (SiN).

13. The semiconductor device according to claim 10, wherein the first ratio is greater than or equal to 35% and is less than or equal to 40%.

14. The semiconductor device according to claim 13, wherein the second ratio is more than 40% and less than or equal to 70%.

15. The semiconductor device according to claim 10, wherein the bit line structure extends in a first direction parallel to an upper surface of the substrate,
the first insulating interlayer covers a sidewall of the second insulating interlayer, and
the first insulating interlayer is divided into two parts in a second direction perpendicular to the first direction at the top of the air spacer.

16. The semiconductor device according to claim 10, wherein the second insulating interlayer covers a lowermost surface of the first insulating interlayer.

17. A semiconductor device comprising:
an active pattern on a substrate;
a gate structure in an upper portion of the active pattern;
a bit line structure on the active pattern, the bit line structure including a doped polysilicon pattern, a metal pattern, and a capping pattern, the doped polysilicon pattern, the metal pattern, and the capping pattern sequentially stacked;
a spacer structure including a first spacer containing a nitride, an air spacer containing air, and a third spacer containing a nitride, the first spacer, the air spacer, and the third spacer sequentially stacked from a sidewall of the bit line structure in a horizontal direction parallel to an upper surface of the substrate;
a contact plug structure on the active pattern, the contact plug structure contacting the spacer structure;
an insulating interlayer structure partially penetrating through upper portions of the contact plug structure, the spacer structure and the bit line structure; and
a capacitor on the contact plug structure,
wherein,
the insulating interlayer structure includes,
    a first insulating interlayer including a first insulation material,
    a second insulating interlayer on the first insulating interlayer, the second insulating interlayer including a second insulation material different from materials included in the first insulation material, and
    a third insulating interlayer on the second insulating interlayer, the third insulating interlayer including a third insulation material,
a lower surface of the second insulating interlayer covers a top of the air spacer, and a lowermost surface of the first insulating interlayer is higher than a lowermost surface of the second insulating interlayer.

18. The semiconductor device according to claim 17, wherein the first insulation material includes silicon carbonitride (SiCN), and the second insulation material includes silicon nitride (SiN).

19. The semiconductor device according to claim 17, wherein the lower surface of the second insulating interlayer is higher than an upper surface of the metal pattern of the bit line structure.

20. The semiconductor device according to claim 17, wherein a second ratio of a thickness of a lowermost portion of the second insulating interlayer to a thickness of an uppermost portion of the second insulating interlayer is greater than a first ratio of a thickness of a lowermost portion of the first insulating interlayer to a thickness of an uppermost portion of the first insulating interlayer, the respective thicknesses of the uppermost portions of the first and second insulating interlayers, being greater than the respective thicknesses of the lowermost portions of the first and second insulating interlayers.

* * * * *